United States Patent
Huang

(10) Patent No.: US 10,916,510 B1
(45) Date of Patent: Feb. 9, 2021

(54) SEMICONDUCTOR DEVICE WITH STRESS-RELIEVING FEATURES AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/688,014

(22) Filed: Nov. 19, 2019

(51) Int. Cl.
*H01L 23/00* (2006.01)
*H01L 23/495* (2006.01)

(52) U.S. Cl.
CPC .......... *H01L 23/562* (2013.01); *H01L 23/495* (2013.01)

(58) Field of Classification Search
CPC .................. H01L 23/562; H01L 23/488
See application file for complete search history.

(56) References Cited

U.S. PATENT DOCUMENTS

2006/0113681 A1* 6/2006 Jeong .................. B23K 3/0623
257/780

* cited by examiner

*Primary Examiner* — Feifei Yeung Lopez
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a semiconductor substrate, a stress-relieving structure including a conductive frame positioned above the semiconductor substrate and a plurality of insulating pillars positioned within the conductive frame, and a conductive structure including a supporting portion positioned above the stress-relieving structure, a conductive portion positioned adjacent to the supporting portion, and a plurality of spacers attached to two sides of the conductive portion. A width of the conductive frame is equal to a width of a bottom of the conductive portion.

20 Claims, 45 Drawing Sheets

SEMICONDUCTOR DEVICE WITH STRESS-RELIEVING FEATURES AND METHOD FOR FABRICATING THE SAME

TECHNICAL FIELD

The present disclosure relates to a semiconductor device and a method for fabricating the semiconductor device, and more particularly, to a semiconductor device with stress-relieving elements and a method for fabricating the semiconductor device with stress-relieving elements.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a semiconductor substrate, a stress-relieving structure including a conductive frame positioned above the semiconductor substrate and a plurality of insulating pillars positioned within the conductive frame, and a conductive structure including a supporting portion positioned above the stress-relieving structure, a conductive portion positioned adjacent to the supporting portion, and a plurality of spacers attached to two sides of the conductive portion. A width of the conductive frame is equal to a width of a bottom of the conductive portion.

In some embodiments, the conductive portion is positioned above the conductive frame.

In some embodiments, a width of a bottom of the conductive structure is greater than a width of the stress-relieving structure.

In some embodiments, the semiconductor device further comprises a bonding pad structure positioned between the conductive structure and the stress-relieving structure, wherein a top surface of the bonding pad structure is in contact with the bottom of the conductive portion.

In some embodiments, the bonding pad structure comprises a bottom bonding pad positioned between the conductive structure and the stress-relieving structure and a top bonding pad positioned on the bottom bonding pad, wherein a top surface of the top bonding pad is in contact with the bottom of the conductive portion.

In some embodiments, a width of the bonding pad structure is greater than the width of the bottom of the conductive structure.

In some embodiments, the conductive structure comprises an upper conductive portion positioned on the supporting portion and the conductive portion.

In some embodiments, the semiconductor device further comprises a bottom passivation film positioned above the semiconductor substrate and a top passivation film positioned on the bottom passivation film, wherein the bonding pad structure is positioned in the bottom passivation film and the top passivation film.

In some embodiments, the semiconductor device further comprises a pair of pad spacers attached to two sides of the bonding pad structure.

In some embodiments, the semiconductor device further comprises a conductive covering film covering the plurality of spacers, portions of the top surface of the top bonding pad, and a top surface of the supporting portion.

In some embodiments, the semiconductor device further comprises a bottom passivation film positioned above the semiconductor substrate and a top passivation film positioned on the bottom passivation film, wherein the supporting portion and the conductive portion are positioned in the bottom passivation film and the top passivation film.

In some embodiments, the semiconductor device further comprises a bottom passivation film positioned above the semiconductor substrate and a top passivation film positioned on the bottom passivation film, wherein the supporting portion and the conductive portion are positioned in the bottom passivation film and the top passivation film, and the supporting portion comprises a lower segment positioned at a same vertical level as the bottom passivation film and an upper segment positioned on the lower segment and at a same vertical level as the top passivation film.

In some embodiments, a horizontal cross-sectional profile of the conductive frame appears as a mesh, concentric rings, or a shape resembling a steering wheel.

In some embodiments, a horizontal cross-sectional profile of the supporting portion appears as a mesh, regularly-aligned pillars, or concentric rings.

In some embodiments, the semiconductor device further comprises a redistribution layer positioned above the semiconductor substrate and electrically coupled to the bonding pad structure.

In some embodiments, the semiconductor device further comprises a stress-absorbing layer positioned between the stress-relieving structure and the bonding pad structure, wherein the stress-absorbing layer is formed of a material having a coefficient of thermal expansion of less than about 20 ppm/° C. and a Young's Modulus of less than about 15 GPa.

In some embodiments, the semiconductor device further comprises a redistribution layer positioned above the stress-absorbing layer and electrically coupled to the bonding pad structure.

In some embodiments, the semiconductor device further comprises a redistribution layer positioned above the semiconductor substrate, wherein the redistribution layer comprises a lower staggered segment positioned at a same vertical level as the stress-absorbing layer and an upper staggered segment positioned on the lower staggered segment and adjacent to the bonding pad structure.

Another aspect of the present disclosure provides a method for fabricating a semiconductor device including providing a semiconductor substrate, forming a stress-relieving structure including a conductive frame above the semiconductor substrate and a plurality of insulating pillars within the conductive frame, and forming a conductive structure including a supporting portion above the stress-relieving structure, a conductive portion adjacent to the supporting portion, and a plurality of spacers attached to two sides of the conductive portion.

In some embodiments, forming the stress-relieving structure comprises: forming a first passivation film above the semiconductor substrate; performing a photolithography process to define a position of the stress-relieving structure on the first passivation film; performing an etch process to form a conductive frame opening in the first passivation film; depositing a conductive material into the conductive frame opening; and performing a planarization process to concurrently form the conductive frame and the plurality of insulating pillars.

Due to the design of the semiconductor device of the present disclosure, stress originating from a wiring process, a process of forming a solder bump, or a packaging process may be reduced by the supporting portion of the conductive structure and the stress-relieving structure. As a result, cracking of the semiconductor device or delamination of interconnection films may be avoided. Therefore, the quality or reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
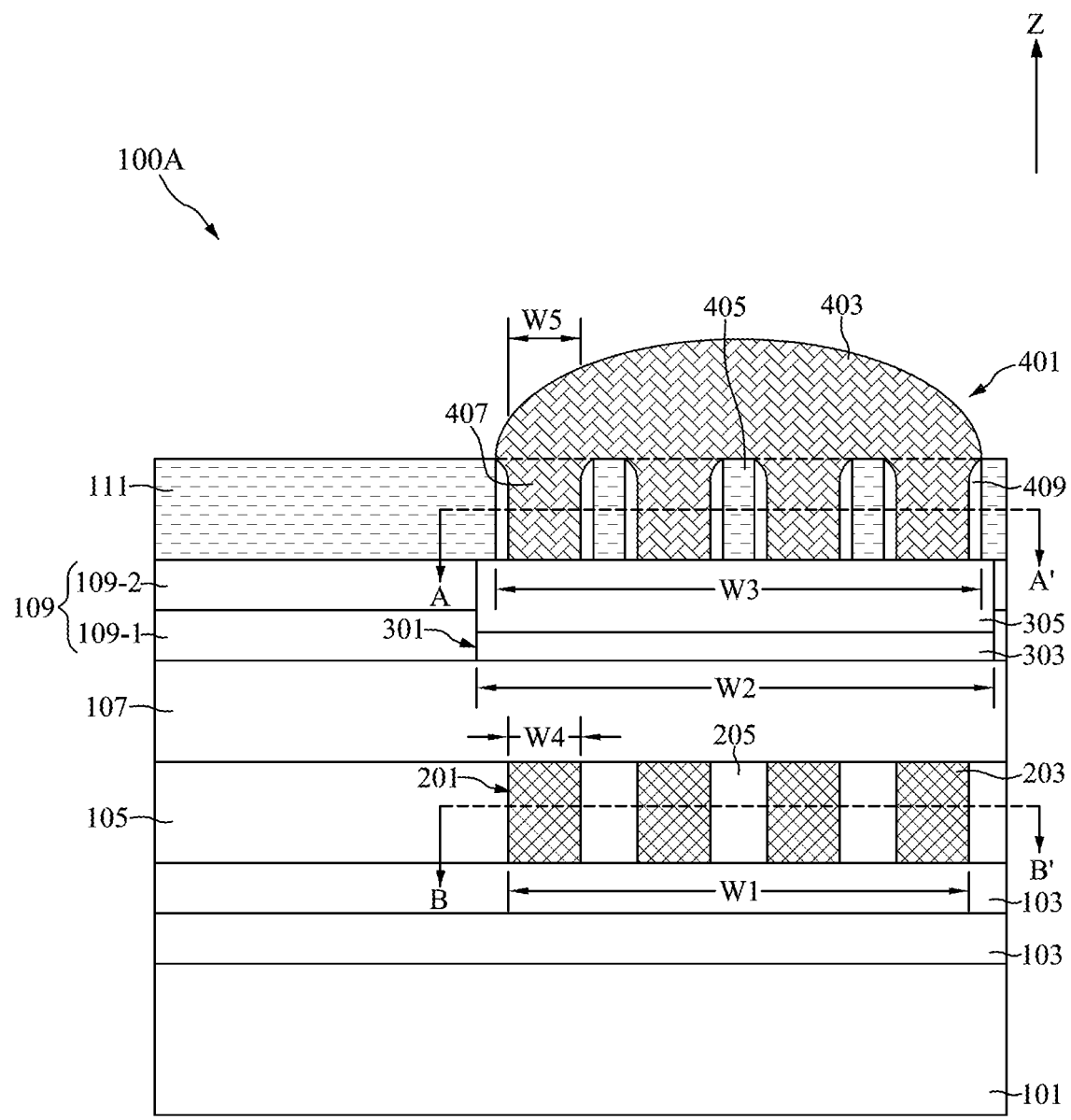
FIG. 1 illustrates, in a schematic vertical cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
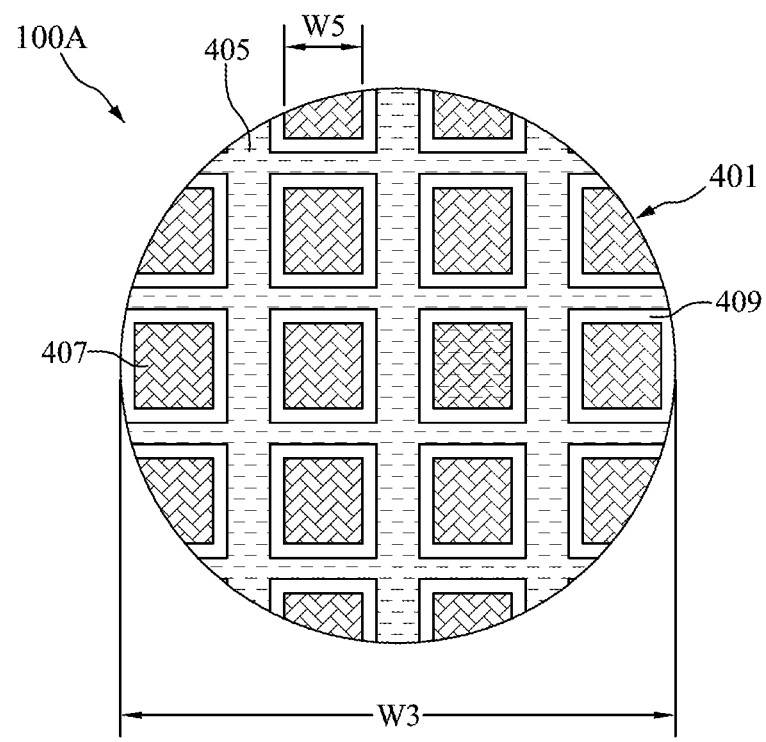
FIG. 2 illustrates, in a schematic cross-sectional view diagram taken along a line A-A' in FIG. 1, part of the semiconductor device in accordance with one embodiment of the present disclosure.
Figure 2:
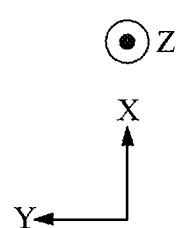
Figure 3:
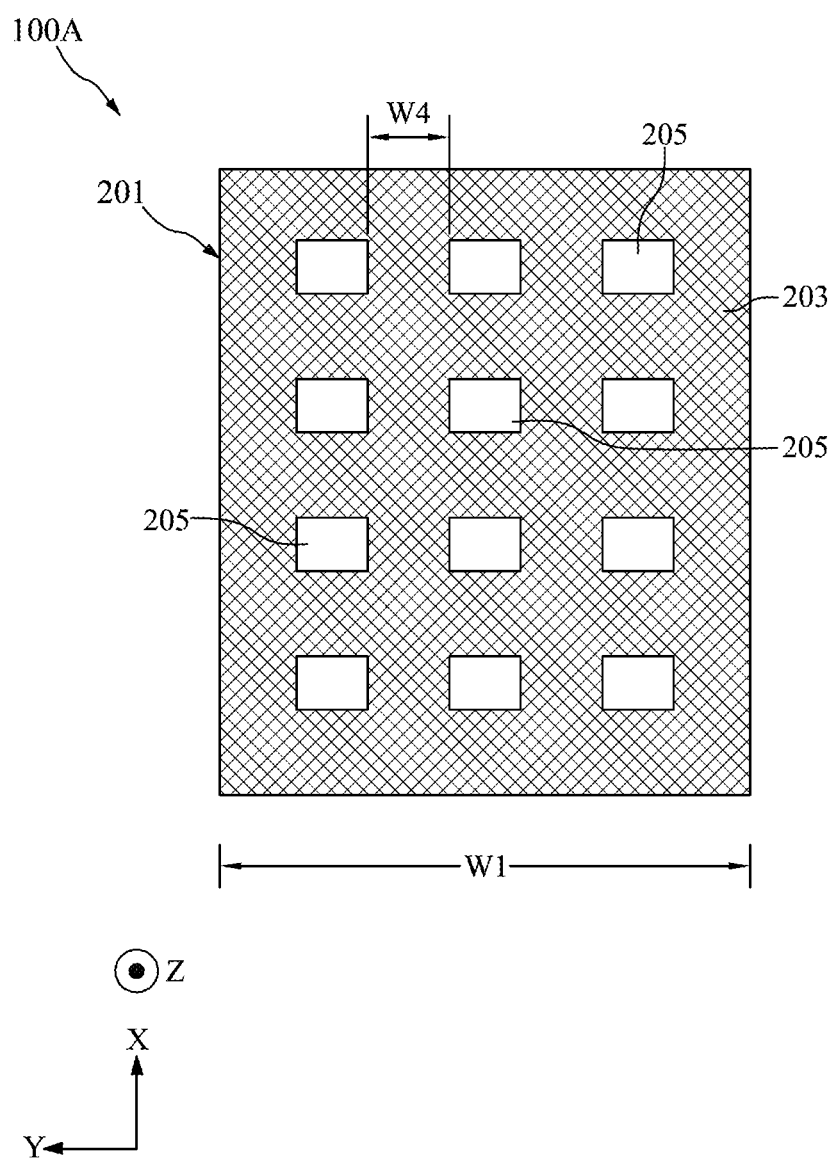
FIG. 3 illustrates, in a schematic cross-sectional view diagram taken along a line B-B' in FIG. 1, part of the semiconductor device in accordance with one embodiment of the present disclosure.

FIG. 1 illustrates, in a schematic vertical cross-sectional view diagram, a semiconductor device 100A in accordance with one embodiment of the present disclosure. FIG. 2 illustrates, in a schematic cross-sectional view diagram taken along a line A-A' in FIG. 1, part of the semiconductor device 100A in accordance with one embodiment of the present disclosure. FIG. 3 illustrates, in a schematic cross-sectional view diagram taken along a line B-B' in FIG. 1, part of the semiconductor device 100A in accordance with one embodiment of the present disclosure. Some elements of the semiconductor device 100A of the present disclosure are not shown in FIGS. 1 to 3 for clarity.

With reference to FIGS. 1 to 3, in the embodiment depicted, the semiconductor device 100A may include a semiconductor substrate 101, a plurality of interconnection films 103, a first passivation film 105, a second passivation film 107, a third passivation film 109, a fourth passivation film 111, a stress-relieving structure 201, a bonding pad structure 301, and a conductive structure 401.

With reference to FIGS. 1 to 3, in the embodiment depicted, the semiconductor substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. Alternatively, in another embodiment, the semiconductor substrate 101 may include an organic semiconductor or a layered semiconductor such as silicon/silicon germanium, silicon-on-insulator or silicon germanium-on-insulator. When the semiconductor substrate 101 is formed of silicon-on-insulator, the semiconductor substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof. Elements such as transistors, capacitors, and interconnects may be disposed within the semiconductor substrate 101 (not shown).

With reference to FIGS. 1 to 3, in the embodiment depicted, the plurality of interconnection films 103 may be disposed on the semiconductor substrate 101. The plurality of interconnection films 103 may serve to further interconnect the various elements disposed within the semiconductor substrate 101. The plurality of interconnection films 103 may include insulating films and conductive layers disposed within the insulating films. The insulating films may be formed of, for example, silicon nitride, silicon oxide, silicon oxynitride, silicon nitride oxide, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, porous polymeric material, or a combination thereof, but are not limited thereto. The conductive layers may be formed of, for example, a conductive material such as doped polysilicon, metal, metal nitride, or metal silicide.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 to 3, in the embodiment depicted, the first passivation film 105 may be disposed on the plurality of interconnection films 103. The first passivation film 105 may seal and protect the plurality of interconnection films 103 and the elements disposed within the semiconductor substrate 101 from damage and contamination. The first passivation film 105 may be formed of, for example, silicon oxide, silicon nitride, silicon oxynitride, silicon oxide nitride, polyimide, phosphosilica glass, undoped silica glass, or fluoride silicate glass.

With reference to FIGS. 1 to 3, in the embodiment depicted, the stress-relieving structure 201 may be disposed above the semiconductor substrate 101 and in the first passivation film 105. The stress-relieving structure 201 may have a first width W1. The stress-relieving structure 201 may include a conductive frame 203 and a plurality of insulating pillars 205. The conductive frame 203 may be disposed above the semiconductor substrate 101 and in the first passivation film 105. The conductive frame 203 may have a same thickness as the first passivation film 105. A bottom of the conductive frame 203 may be disposed on a top surface of a topmost film of the plurality of interconnection films 103. A horizontal cross-sectional profile of the conductive frame 203 may appear as a mesh. That is, members of the conductive frame 203 may be connected to each other. In the vertical cross-sectional diagram in FIG. 1, four cross-sectional members of the conductive frame 203 may be shown. Each of the four cross-sectional members of the conductive frame 203 may have a fourth width W4. The conductive frame 203 may be formed of, for example, a conductive material such as metal, metal nitride, or metal silicide.

With reference to FIGS. 1 to 3, in the embodiment depicted, the plurality of insulating pillars 205 may be disposed within the conductive frame 203. The plurality of insulating pillars 205 may have a same thickness as the first passivation film 105. Bottoms of the plurality of insulating pillars 205 may be disposed on the top surface of the topmost film of the plurality of interconnection films 103. A horizontal cross-sectional profile of the plurality of insulating pillars 205 may appear as regularly-aligned pillars. The regularly-aligned pillars of the plurality of insulating pillars 205 may be rectangular. Alternatively, in another embodiment, the regularly-aligned pillars of the plurality of insulating pillars 205 may be square, polygonal, or oval. The polygonal form may be a triangle, rectangle, trapezoid, parallelogram, rhombus, pentagon, or hexagon, but is not limited thereto. The plurality of insulating pillars 205 may be formed of a same material as the first passivation film 105, but are not limited thereto. Alternatively, in another embodiment, the plurality of insulating pillars 205 may be formed of a material including polyimide or an epoxy-based material. The stress-relieving structure 201 may serve as a cushion to reduce a stress of a bumping process or a wiring process.

With reference to FIGS. 1 to 3, in the embodiment depicted, the second passivation film 107 may be disposed on the first passivation film 105. A bottom of the second passivation film 107 may be disposed on a top surface of the stress-relieving structure 201. Specifically, the bottom of the second passivation film 107 may be disposed on top surfaces of the conductive frame 203 and the plurality of insulating pillars 205. The second passivation film 107 may be formed of a same material as the first passivation film 105, but is not limited thereto.

With reference to FIGS. 1 to 3, in the embodiment depicted, the third passivation film 109 may be disposed on the second passivation film 107. The third passivation film 109 may include a third bottom passivation film 109-1 and a third top passivation film 109-2. The third bottom passivation film 109-1 may be disposed on the second passivation film 107. The third bottom passivation film 109-1 may be formed of a same material as the first passivation film 105, but is not limited thereto. The third top passivation film 109-2 may be disposed on the third bottom passivation film 109-1. The third top passivation film 109-2 may be formed of a same material as the first passivation film 105 and a different material than the third bottom passivation film 109-1, but is not limited thereto. In the embodiment depicted, the third bottom passivation film 109-1 may be formed of, for example, silicon oxide or phosphosilica glass. The third top passivation film 109-2 may be formed of, for example, silicon nitride, silicon oxynitride, or silicon oxide nitride. The third top passivation film 109-2 may serve as a high vapor barrier in order to prevent moisture from entering from above.

With reference to FIGS. 1 to 3, in the embodiment depicted, the bonding pad structure 301 may be disposed above the semiconductor substrate 101 and in the third passivation film 109. The bonding pad structure 301 may have a second width W2. The second width W2 of the bonding pad structure 301 may be greater than the first width W1 of the stress-relieving structure 201. The bonding pad structure 301 may include a bottom bonding pad 303 and a top bonding pad 305. The bottom bonding pad 303 may be disposed on the second passivation film 107 and in the third bottom passivation film 109-1. A thickness of the bottom bonding pad 303 may be less than a thickness of the third bottom passivation film 109-1. The bottom bonding pad 303 may be formed of a material including nickel. The top bonding pad 305 may be disposed on the bottom bonding pad 303 and in the third bottom passivation film 109-1 and the third top passivation film 109-2. A top surface of the top bonding pad 305 may be even with a top surface of the third top passivation film 109-2. The top bonding pad 305 may include palladium, cobalt, or a combination thereof. The bonding pad structure 301 may be electrically coupled to the conductive layers of the plurality of interconnection films 103 (not shown).

With reference to FIGS. 1 to 3, in the embodiment depicted, the fourth passivation film 111 may be disposed on the third top passivation film 109-2 and the top surface of the top bonding pad 305. The fourth passivation film 111 may be formed of, for example, silicon oxide, silicon nitride, silicon oxynitride, silicon oxide nitride, polyimide, phosphosilica glass, undoped silica glass, fluoride silicate glass, titanium oxide, aluminum oxide, polyimide, polybenzoxazole, or a combination thereof.

With reference to FIGS. 1 to 3, in the embodiment depicted, a lower portion of the conductive structure 401 may be disposed in the fourth passivation film 111 and an upper portion of the conductive structure 401 may be disposed on a top surface of the fourth passivation film 111. The lower portion of the conductive structure 401 may include a patterned structure. The patterned structure may be disposed on the top surface of the top bonding pad 305 and in the fourth passivation film 111. A top surface of the patterned structure may be even with the top surface of the fourth passivation film 111. A bottom of the patterned structure may have a third width W3. That is, a bottom of the conductive structure 401 may have the third width W3. The third width W3 of the bottom of the patterned structure of the conductive structure 401 may be less than the second width W2 of the bonding pad structure 301. The third width W3 of the bottom of the patterned structure of the conductive structure 401 may be greater than the first width of the stress-relieving structure 201. In the embodiment depicted, a boundary of the patterned structure may be a circle. Alternatively, in another embodiment, the boundary of the patterned structure may a polygon or an oval. The polygon may be a triangle, rectangle, trapezoid, parallelogram, rhombus, pentagon, or hexagon, but is not limited thereto.

With reference to FIGS. 1 to 3, in the embodiment depicted, the patterned structure may include a supporting portion 405, a conductive portion 407, and a plurality of spacers 409. The supporting portion 405 may be disposed on the top surface of the top bonding pad 305. The supporting portion 405 may have a same thickness as the fourth passivation film 111. A top surface of the supporting portion 405 may be even with the top surface of the fourth passivation film 111. In the embodiment depicted, a horizontal cross-sectional profile of the supporting portion 405 may appear as a mesh. In the vertical cross-sectional diagram in FIG. 1, three cross-sectional portions of the supporting portion 405 may be shown. The three cross-sectional portions of the supporting portion 405 may be separately disposed on the top bonding pad 305. The supporting portion 405 may be formed of a same material as the fourth passivation film 111, but is not limited thereto. The supporting portion 405 may reduce stress during a packaging process to reduce warpage of the semiconductor device 100A.

With reference to FIGS. 1 to 3, in the embodiment depicted, the conductive portion 407 may have a same thickness as the fourth passivation film 111. The conductive portion 407 may be formed of, for example, a material including tin, silver, copper, gold, alloy or a combination thereof. In the embodiment depicted, a horizontal cross-sectional profile of the conductive portion 407 may appear as regularly-aligned pillars. The regularly-aligned pillars may be square.

The conductive portion 407 may appear as surrounded by the supporting portion 405 in the top view diagram in FIG. 2.

In the vertical cross-sectional diagram in FIG. 1, four cross-sectional portions of the conductive portion 407 may be shown. The four cross-sectional portions of the conductive portion 407 may be disposed adjacent to the three cross-sectional portions of the supporting portion 405. Specifically, the four cross-sectional portions of the conductive portion 407 and the three cross-sectional portions of the supporting portion 405 may be alternatively disposed on the top bonding pad 305. Each bottom of the four cross-sectional portions of the conductive portion 407 may have a fifth width W5. The fifth width W5 of each bottom of the four cross-sectional portions of the conductive portion 407 may be equal to the fourth width W4 of each of the four cross-sectional members of the conductive frame 203.

With reference to FIGS. 1 to 3, in the embodiment depicted, the conductive portion 407 may be disposed above the conductive frame 203. Specifically, the four cross-sectional portions of the conductive portion 407 may be directly above the four cross-sectional members of the conductive frame 203. Accordingly, the supporting portion 405 may be disposed above the plurality of insulating pillars 205. It should be noted that portions of the conductive frame 203 may not have corresponding portions of the conductive portion 407 disposed thereon. Accordingly, portions of the supporting portion 405 may not have corresponding portions of the plurality of insulating pillars 205 disposed therebelow.

With reference to FIG. 2, the plurality of spacers 409 may surround the conductive portion 407 and be surrounded by the supporting portion 405. In the vertical cross-sectional diagram in FIG. 1, the plurality of spacers 409 may be attached to two sides of the four cross-sectional portions of the conductive portion 407. Bottoms of the plurality of spacers 409 may be disposed on the top surface of the top bonding pad 305. The plurality of spacers 409 may be formed of, for example, silicon oxide, silicon nitride, silicon oxynitride, or silicon oxide nitride.

With reference to FIGS. 1 to 3, in the embodiment depicted, the upper portion of the conductive structure 401 may include an upper conductive portion 403. The upper conductive portion 403 may be disposed on the top surfaces of the supporting portion 405 and the conductive portion 407. The upper conductive portion 403 may be formed of a same material as the conductive portion 407, but is not limited thereto. The conductive structure 401 may serve as an agent to mechanically and electrically connect the semiconductor device 100A to a substrate for packaging.

During a wiring process, a process of forming a solder bump, or a packaging process, stress may be applied to semiconductor device and the stress may cause delamination of the plurality of interconnection films 103. To reduce the effect of the stress of the aforementioned processes, the supporting portion 405 of the conductive structure 401 and the stress-relieving structure 201 directly below the conductive structure 401 and the bonding pad structure 301 may serve as a cushion to reduce the stress of the aforementioned processes, reduce the semiconductor device 100A warpage, and prevent films underneath the stress-relieving structure 201 from delaminating.

In addition, the members of the conductive frame 203 of the stress-relieving structure 201 are connected to each other and may distribute the stress throughout the entire conductive frame 203; therefore, the conductive frame 203 may provide a better stress-buffering capability compared to a standalone anti-stress structure. Furthermore, the plurality of insulating pillars 205 formed of the material including polyimide or the epoxy-based material may be capable of absorbing and distributing the stress to further improve the stress-buffering capability of the stress-relieving structure 201. In addition, the stress of the aforementioned processes may mainly propagate along the Z direction; therefore, the conductive frame 203 disposed directly below the conductive portion 407 may provide a more efficient means to relieve the stress of the aforementioned processes.

Figure 4:
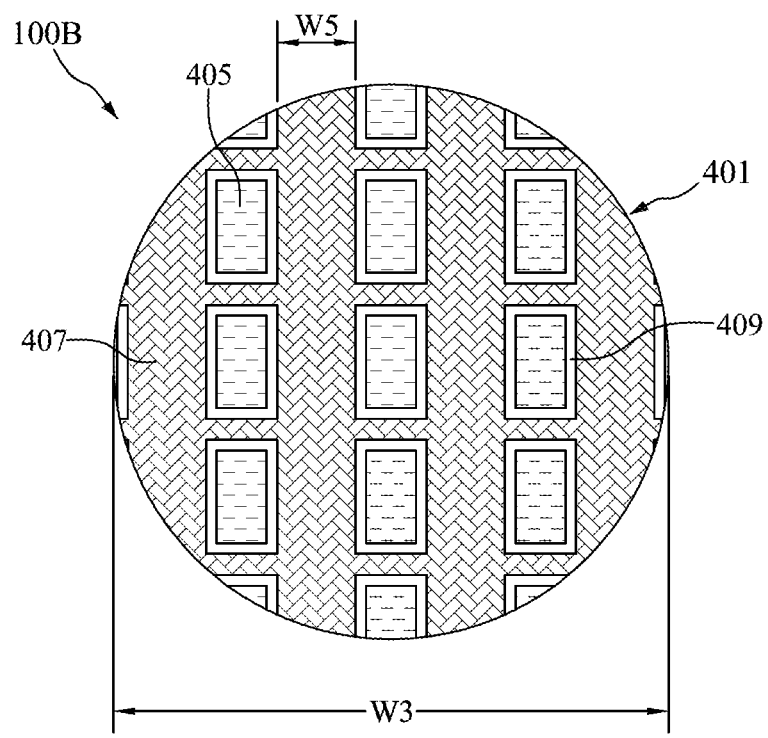
FIGS. 4 to 6 illustrate, in schematic cross-sectional view diagrams taken along a line A-A' in FIG. 1, parts of semiconductor devices in accordance with other embodiments of the present disclosure.
Figure 5:
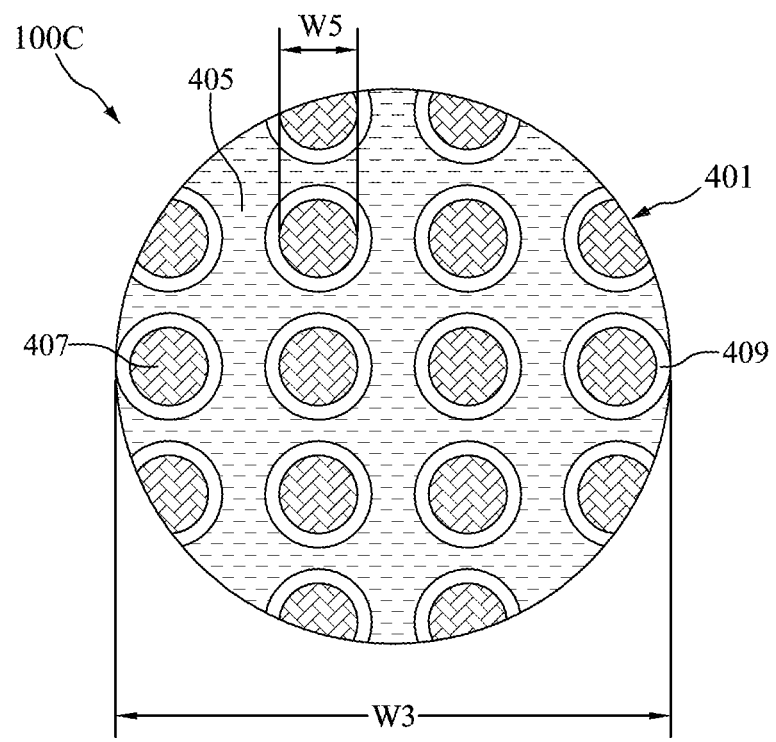
Figure 5:
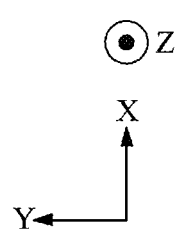
Figure 6:
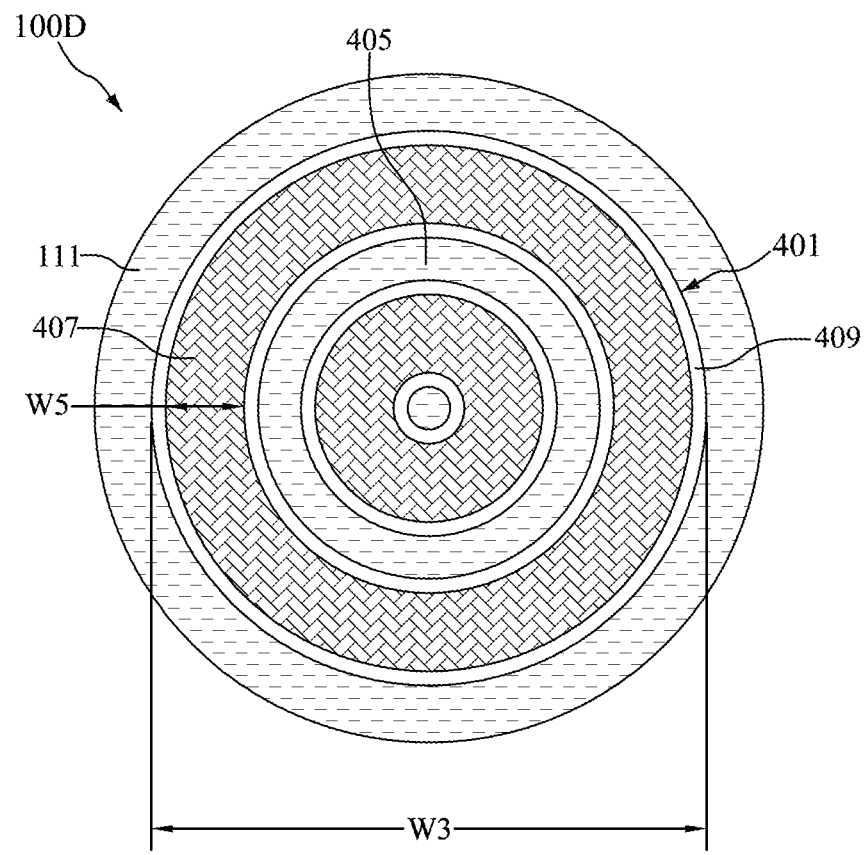
Figure 7:
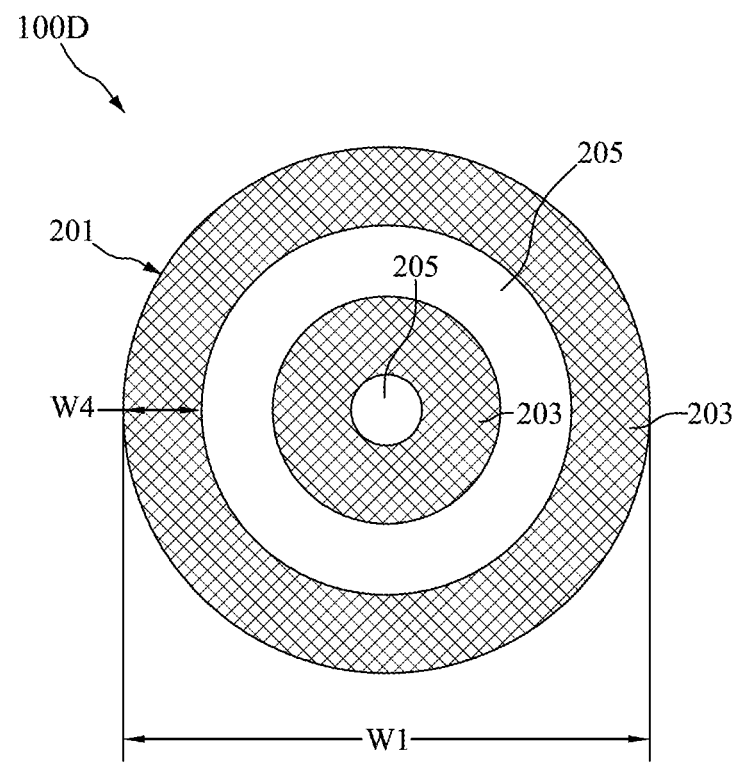
FIGS. 7 and 8 illustrate, in schematic cross-sectional view diagrams taken along a line B-B' in FIG. 1, parts of semiconductor devices in accordance with other embodiments of the present disclosure.
Figure 8:
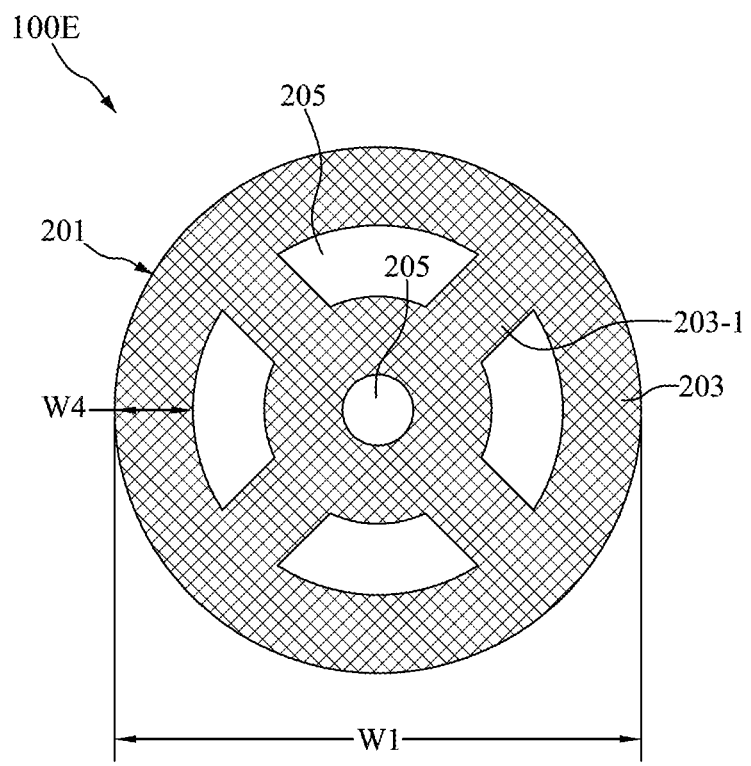
Figure 8:
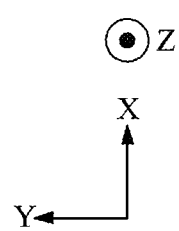

FIGS. 4 to 6 illustrate, in schematic cross-sectional view diagrams taken along a line A-A' in FIG. 1, parts of semiconductor devices 100B, 100C and 100D in accordance with other embodiments of the present disclosure. FIGS. 7 and 8 illustrate, in schematic cross-sectional view diagrams taken along a line B-B' in FIG. 1, parts of semiconductor devices 100D and 100E in accordance with other embodiments of the present disclosure. Some elements of the semiconductor device 100B, 100C, 100D and 100E of the present disclosure are not shown in FIGS. 4 to 8 for clarity.

With reference to FIG. 4, in one embodiment of the semiconductor device 100B, the horizontal cross-sectional profile of the supporting portion 405 may appear as regularly-aligned pillars. The regularly-aligned pillars may be rectangular. The horizontal cross-sectional profile of the conductive portion 407 may appear as a mesh. The conductive portion 407 may surround the supporting portion 405. In other words, the supporting portion 405 may be disposed within the conductive portion 407. The plurality of spacers 409 may respectively correspondingly surround the supporting portion 405.

With reference to FIG. 5, in one embodiment of the semiconductor device 100C, the horizontal cross-sectional profile of the conductive portion 407 may appear as regularly-aligned pillars.

The regularly-aligned pillars may be circular. The horizontal cross-sectional profile of the supporting portion 405 may appear as a mesh. The supporting portion 405 may surround the conductive portion 407. In other words, the conductive portion 407 may be disposed within the supporting portion 405. The plurality of spacers 409 may respectively correspondingly surround the conductive portion 407.

With reference to FIGS. 6 and 7, in one embodiment of the semiconductor device 100D, the horizontal cross-sectional profile of the conductive portion 407 may appear as concentric rings. The horizontal cross-sectional profile of the supporting portion 405 may appear as concentric rings. The supporting portion 405 and the conductive portion 407 may be alternatively disposed on the top bonding pad 305. The plurality of spacers 409 may respectively correspondingly surround the conductive portion 407 and the supporting portion 405. The horizontal cross-sectional profile of the conductive frame 203 may appear as concentric rings. The conductive frame 203 may be directly below the conductive portion 407. The horizontal cross-sectional profile of the plurality of insulating pillars 205 may appear as concentric rings. The conductive frame 203 and the plurality of insulating pillars 205 may be alternatively disposed on the plurality of interconnection films 103.

With reference to FIG. 8, in one embodiment of the semiconductor device 100E, the horizontal cross-sectional profile of the conductive frame 203 may appear as a shape resembling a steering wheel. That is, an outer circle of the conductive frame 203 and an inner circle of the conductive frame 203 may be connected by at least one connecting member 203-1. As a result, the stress-buffering capability of the conductive frame 203 may be improved.

FIGS. 9 to 15 illustrate, in schematic vertical cross-sectional view diagrams, semiconductor devices 100F, 100G, 100H, 100I, 100J, 100K and 100L in accordance with other embodiments of the present disclosure.

Figure 9:
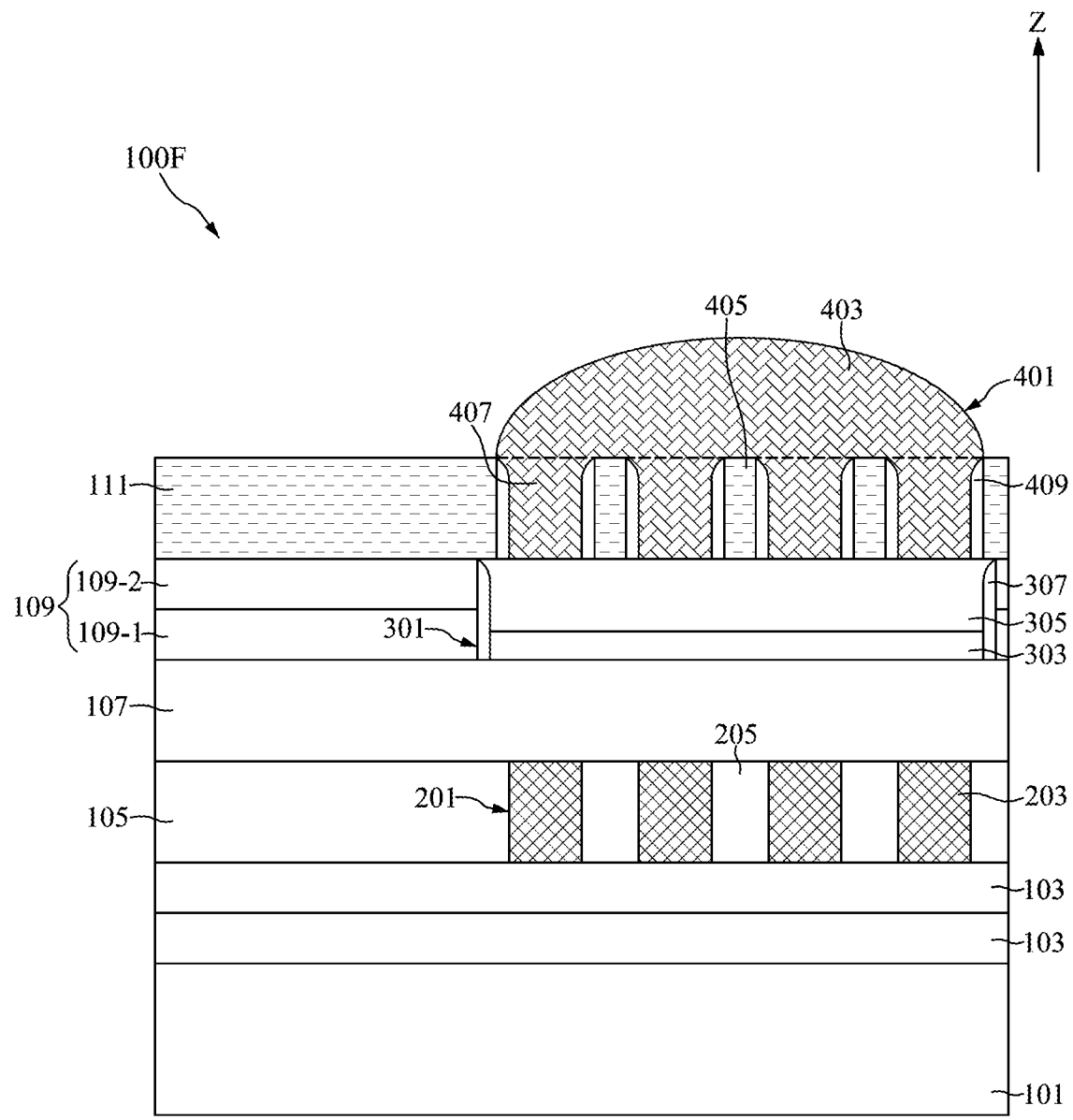
FIGS. 9 to 15 illustrate, in schematic vertical cross-sectional view diagrams, semiconductor devices in accordance with other embodiments of the present disclosure.

With reference to FIG. 9, the semiconductor device 100F may include a pair of pad spacers 307. The pair of pad spacers 307 may be attached to two sides of the bonding pad structure 301. In other words, the pair of pad spacers 307 may be attached to sidewalls of the top bonding pad 305 and the bottom bonding pad 303. The pair of pad spacers 307 may isolate the sidewalls of the third bottom passivation film 109-1 and the third top passivation film 109-2 to prevent undesirable sidewall growth.

Figure 10:
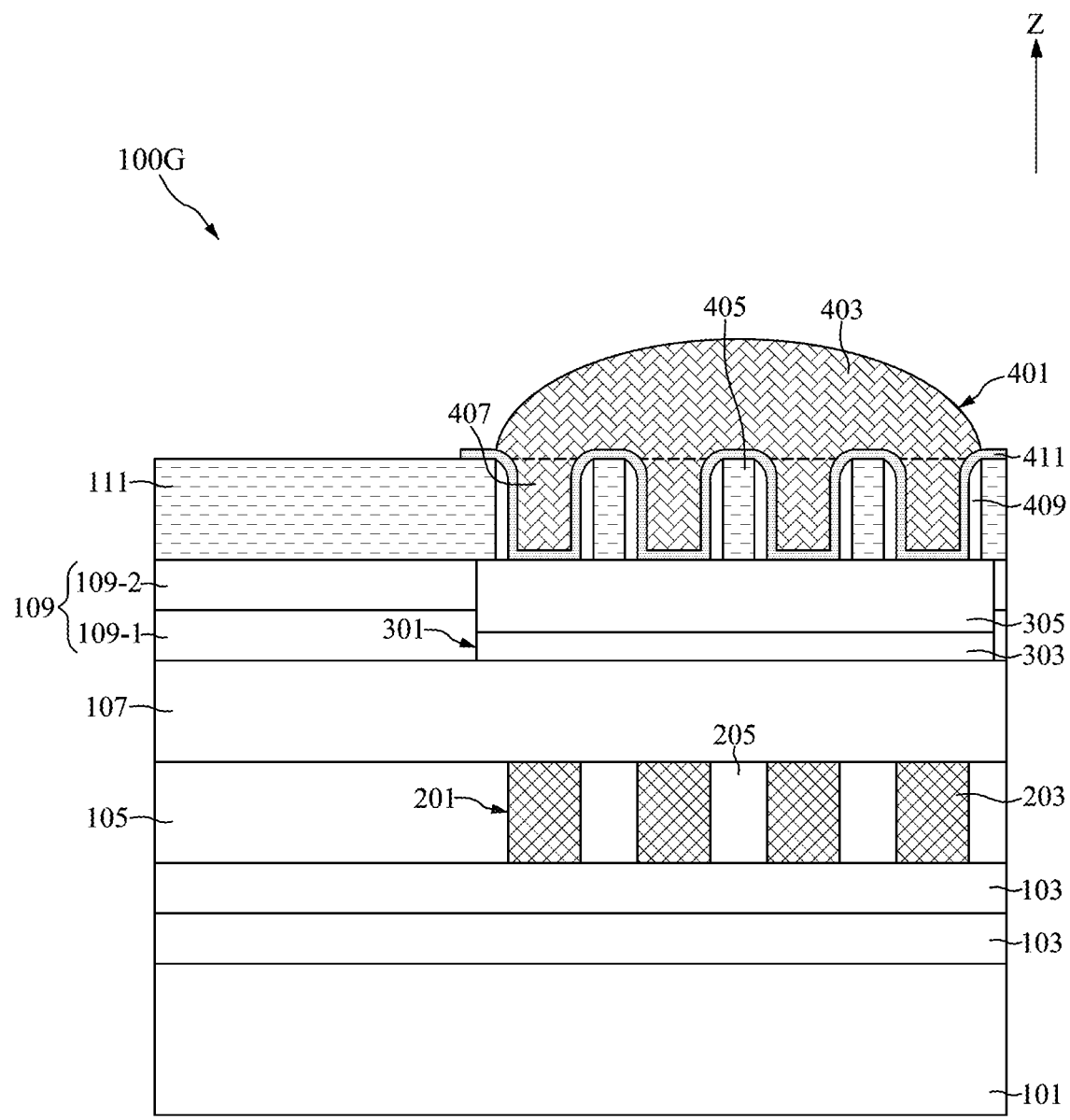

With reference to FIG. 10, the semiconductor device 100G may include a conductive covering film 411. The conductive covering film 411 may cover the plurality of spacers 409, portions of the top surface of the top bonding pad 305, and a top surface of the supporting portion 405. The conductive covering film 411 may be disposed between the plurality of spacers 409 and the conductive portion 407 and between the upper conductive portion 403 and the supporting portion 405. The conductive covering film 411 may serve as a barrier to protect the bonding pad structure 301 during a wiring process, a process of forming a solder bump, or a packaging process. The conductive covering film 411 may be formed of, for example, a conductive material such as copper, aluminum, nickel, titanium, titanium nitride, tungsten nitride, tin, silver, gold, chromium, alloy or a combination thereof.

Figure 11:
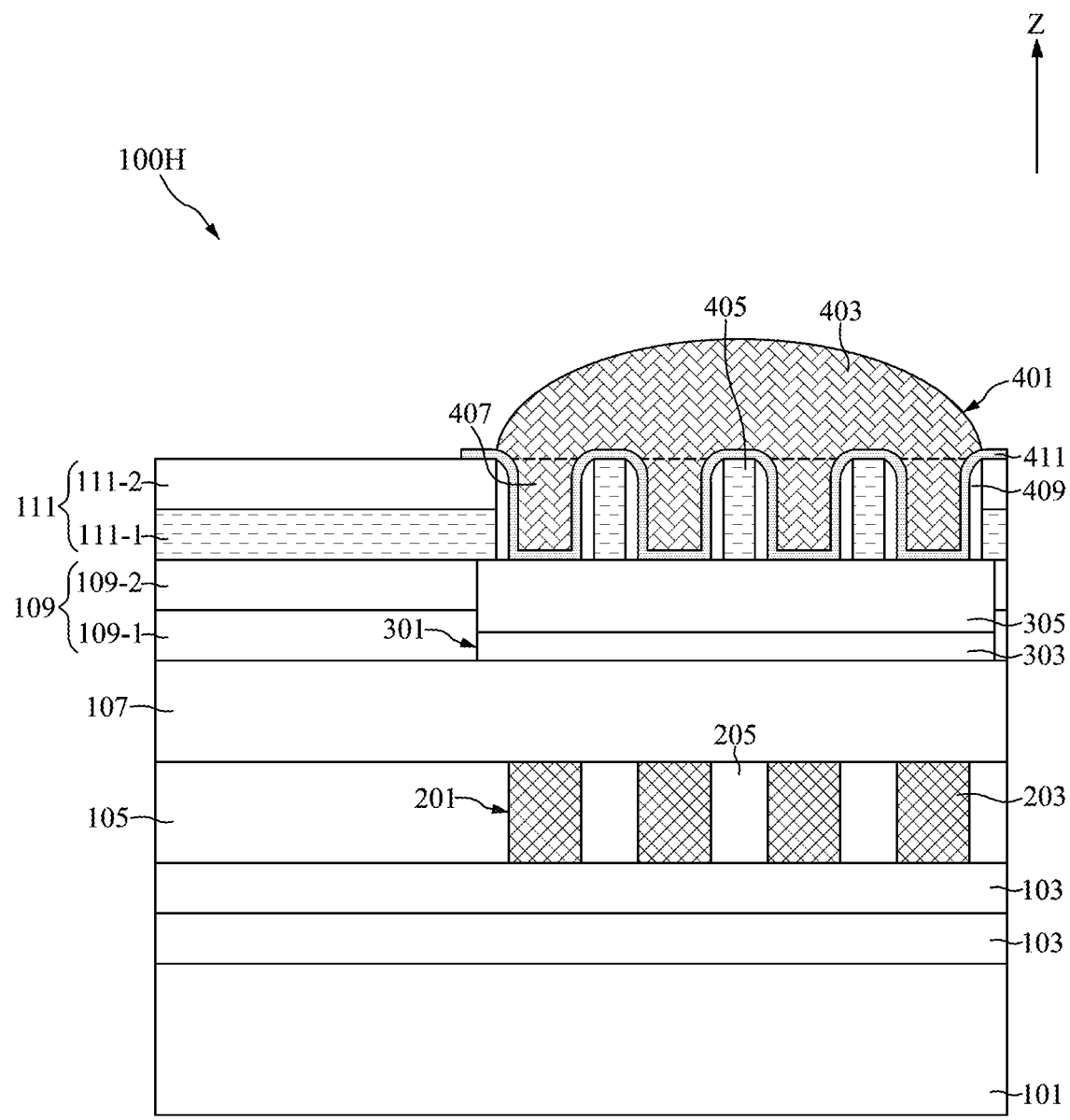

With reference to FIG. 11, in one embodiment of the semiconductor device 100H, the fourth passivation film 111 may be a stacked film including a fourth bottom passivation film 111-1 and a fourth top passivation film 111-2. The fourth bottom passivation film 111-1 may be disposed on the third top passivation film 109-2 and the top bonding pad 305. The fourth top passivation film 111-2 may be disposed on the fourth bottom passivation film 111-1. The fourth bottom passivation film 111-1 and the fourth top passivation film 111-2 may be formed of a same material as the first passivation film 105, but is not limited thereto. However, the fourth bottom passivation film 111-1 may be formed of a different material than the fourth top passivation film 111-2.

Figure 12:
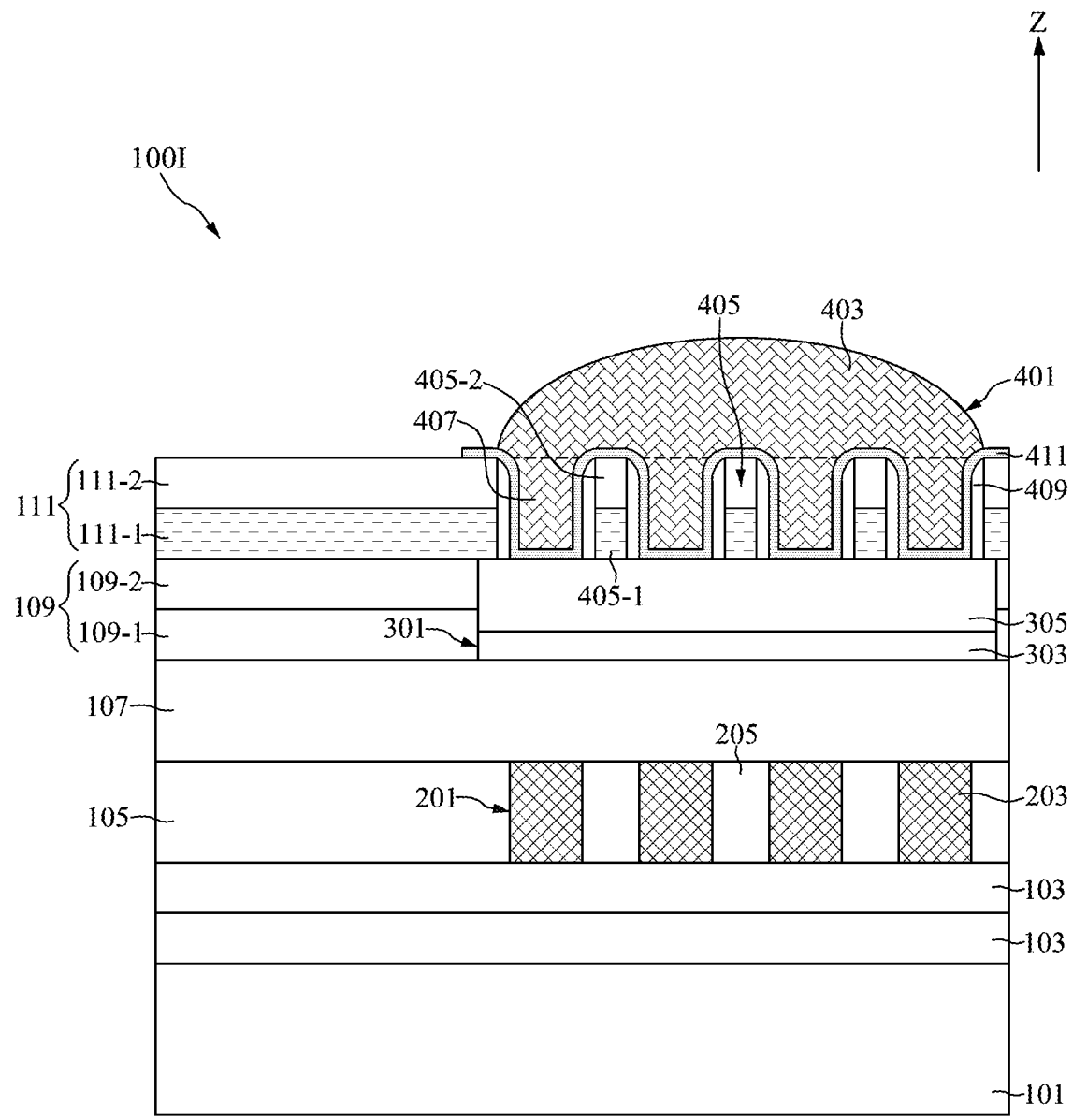

With reference to FIG. 12 and in comparison to FIG. 11, in one embodiment of the semiconductor device 100I, the supporting portion 405 may include a lower segment 405-1 and an upper segment 405-2. The lower segment 405-1 may be disposed on the top bonding pad 305 and at a same vertical level as the fourth bottom passivation film 111-1. The upper segment 405-2 may be disposed on the lower segment 405-1 and at a same vertical level as the fourth top passivation film 111-2. The lower segment 405-1 may be formed of a different material than the upper segment 405-2 and may be formed of a same material as the fourth bottom passivation film 111-1. The upper segment 405-2 may be formed of a same material as the fourth top passivation film 111-2. The lower segment 405-1 and the upper segment 405-2 may be respectively correspondingly formed from the fourth bottom passivation film 111-1 and the fourth top passivation film 111-2.

Figure 13:
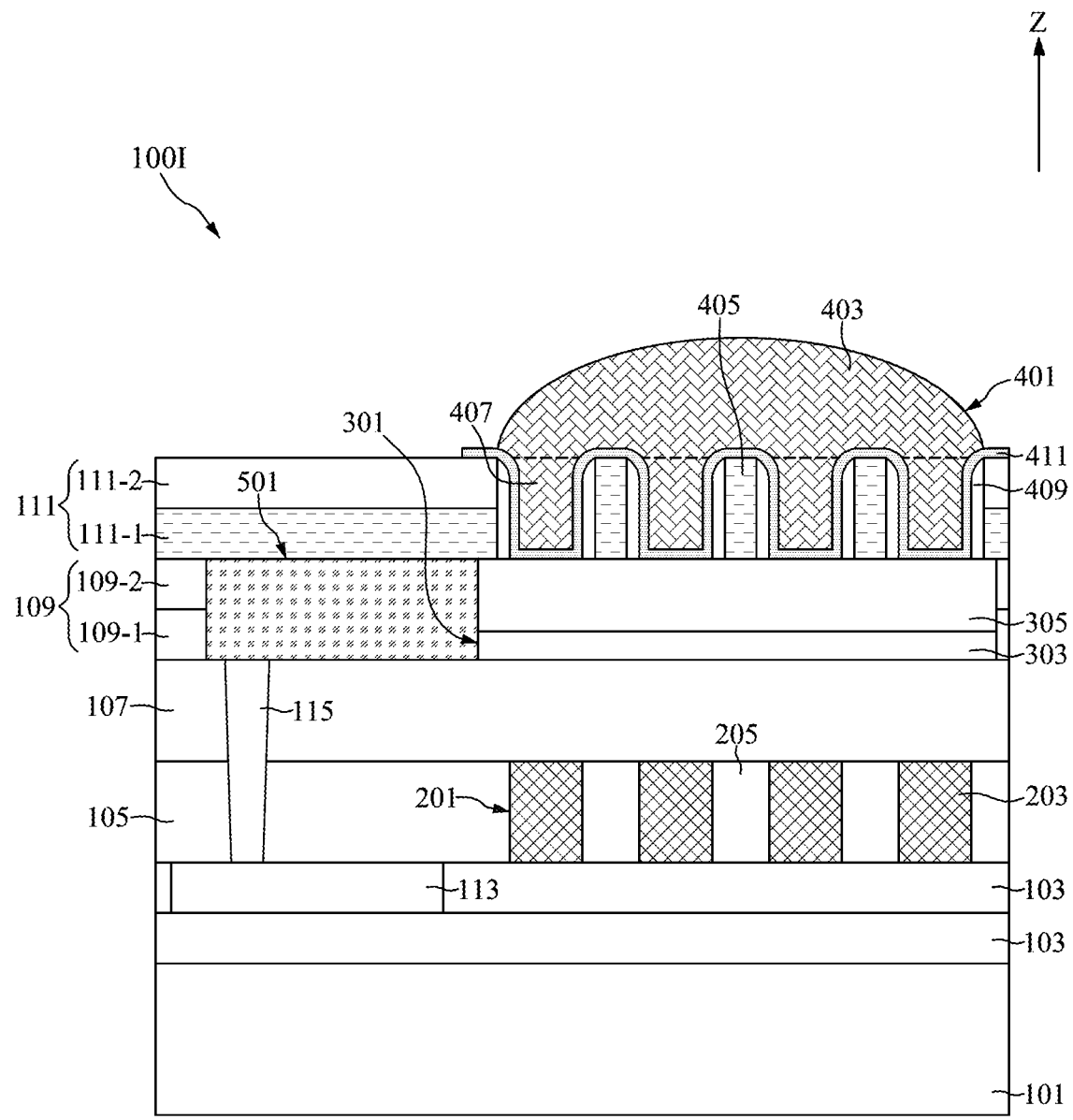

With reference to FIG. 13, the semiconductor device 100J may include a redistribution layer 501. The redistribution layer 501 may be disposed in the third passivation film 109 and electrically coupled to a topmost conductive layer 113 disposed in the plurality of interconnection films 103 through a conductive plug 115. One end of the redistribution layer 501 may contact the bonding pad structure 301. An opposite end of the redistribution layer 501 may extend a distance horizontally away from the bonding pad structure 301. The redistribution layer 501 may be formed of, for example, tin, nickel, copper, gold, aluminum, or an alloy thereof.

Figure 14:
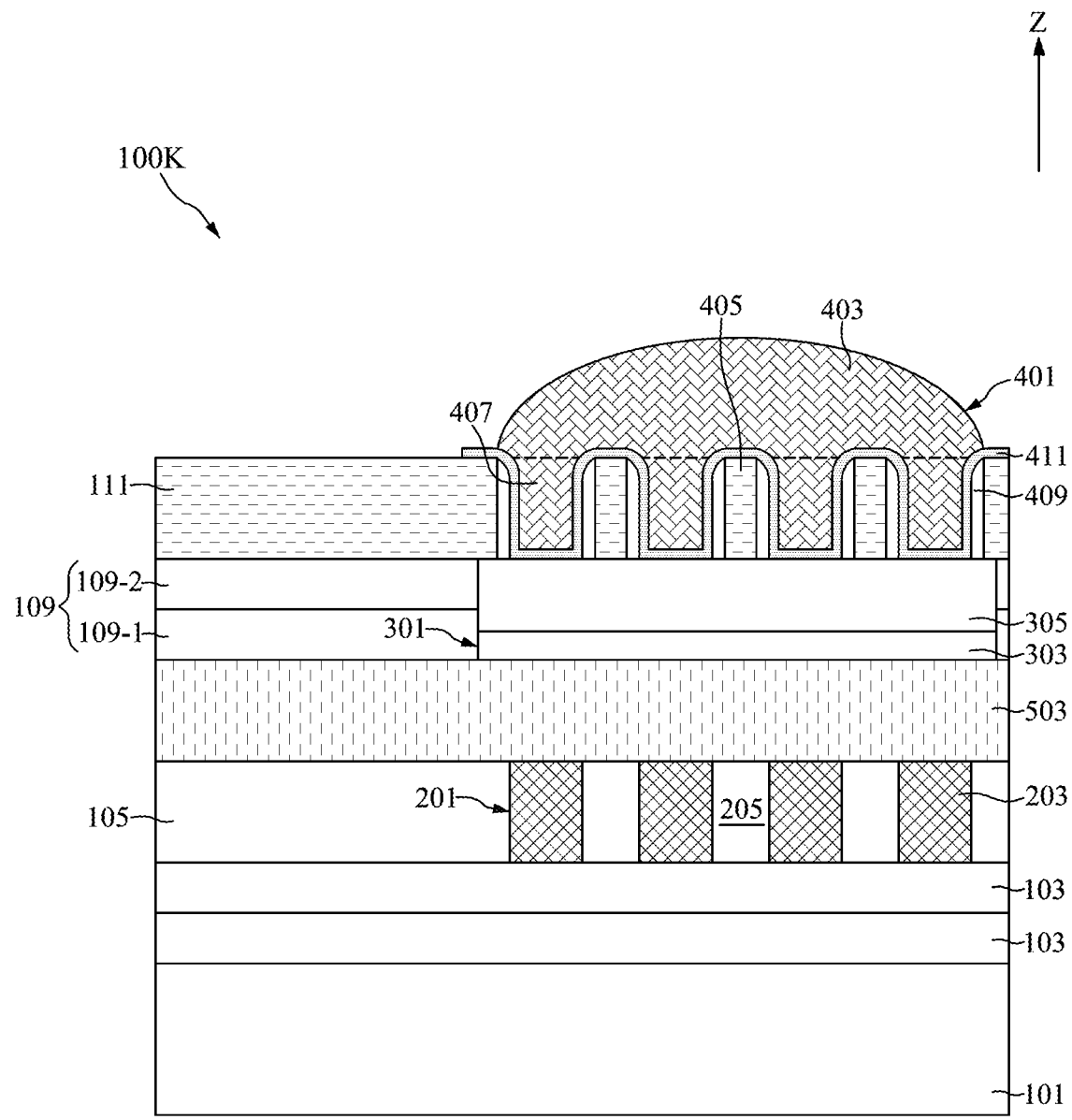

With reference to FIG. 14, the semiconductor device 100K may include a stress-absorbing layer 503. The stress-absorbing layer 503 may be disposed between the third passivation film 109 and the first passivation film 105. A top surface of the stress-absorbing layer 503 may contact a bottom of the third bottom passivation film 109-1. A bottom of the stress-absorbing layer 503 may contact the top surfaces of the first passivation film 105 and the stress-relieving structure 201.

The stress-absorbing layer 503 may be utilized to absorb and redistribute the stress concentrated on the underlying layers created by the shear stresses from thermal expansion mismatches and normal stresses due to a wiring process, a process of forming a solder bump, or a packaging process. The stress-absorbing layer 503 may be formed of, for example, a material having a coefficient of thermal expansion of less than about 20 ppm/° C. and a Young's Modulus of less than about 15 GPa. Specifically, the stress-absorbing layer 503 may be formed of a material including polyimide or an epoxy-based material. The stress-absorbing layer 503 may have a thickness between about 0.5 µm and about 1.0 µm. Preferably, the thickness of the stress-absorbing layer 503 may be between about 10,000 angstroms and about 50,000 angstroms.

Figure 15:
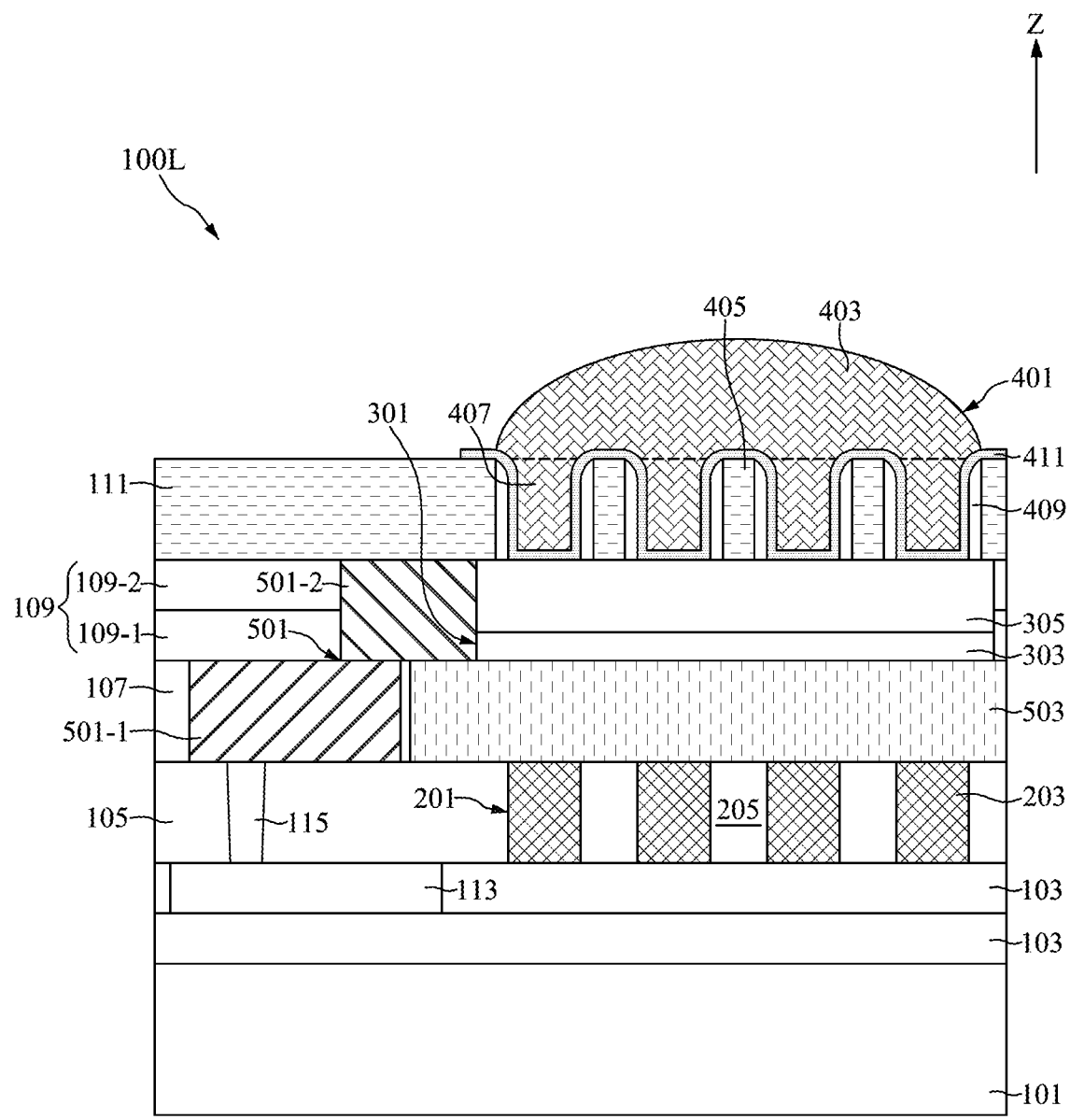

With reference to FIG. 15, in one embodiment of the semiconductor device 100L, the stress-absorbing layer 503 may be disposed in the second passivation film 107 and between the bonding pad structure 301 and the stress-relieving structure 201. The redistribution layer 501 may include a lower staggered segment 501-1 and an upper staggered segment 501-2. The lower staggered segment 501-1 may be disposed in the second passivation film 107 and may be distant from the stress-absorbing layer 503. The upper staggered segment 501-2 may be disposed in the third passivation film 109. One end of the upper staggered segment 501-2 may contact the bonding pad structure 301. An opposite end of the upper staggered segment 501-2 may extend a distance horizontally away from the bonding pad structure 301 and contact a portion of a top surface of the lower staggered segment 501-1.

Figure 16:
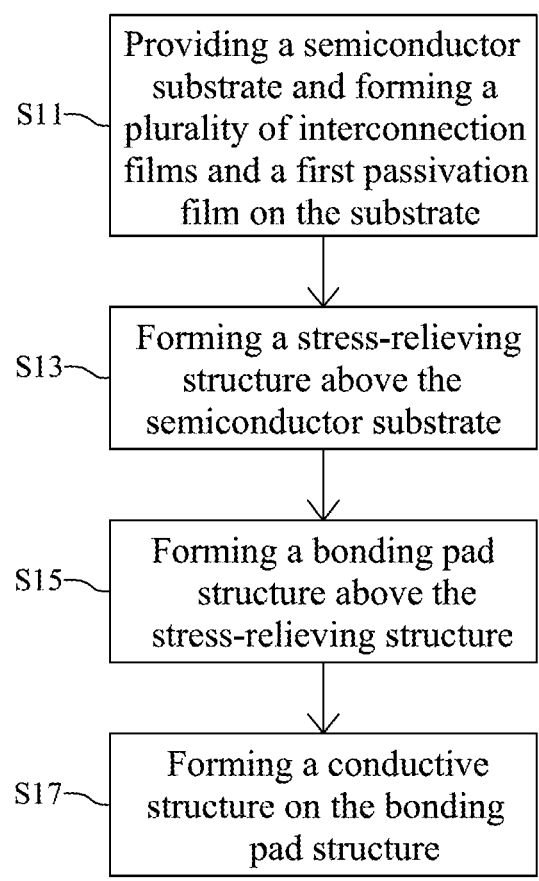
FIG. 16 illustrates, in a flowchart diagram form, a method for fabricating a semiconductor device in accordance with one embodiment of the present disclosure.

FIG. 16 illustrates, in a flowchart diagram form, a method 10 for fabricating a semiconductor device 100A in accordance with one embodiment of the present disclosure. FIGS. 17 to 20 illustrate, in schematic cross-sectional diagrams, part of a flow of fabricating the semiconductor device 100A in accordance with one embodiment of the present disclosure. FIG. 21 illustrates, in a schematic cross-sectional view diagram taken along a line A-A' in FIG. 20, part of a flow of fabricating the semiconductor device 100A in accordance with one embodiment of the present disclosure. FIGS. 22 to 30 illustrate, in schematic cross-sectional diagrams, part of a flow of fabricating the semiconductor device 100A in accordance with one embodiment of the present disclosure.

Figure 17:
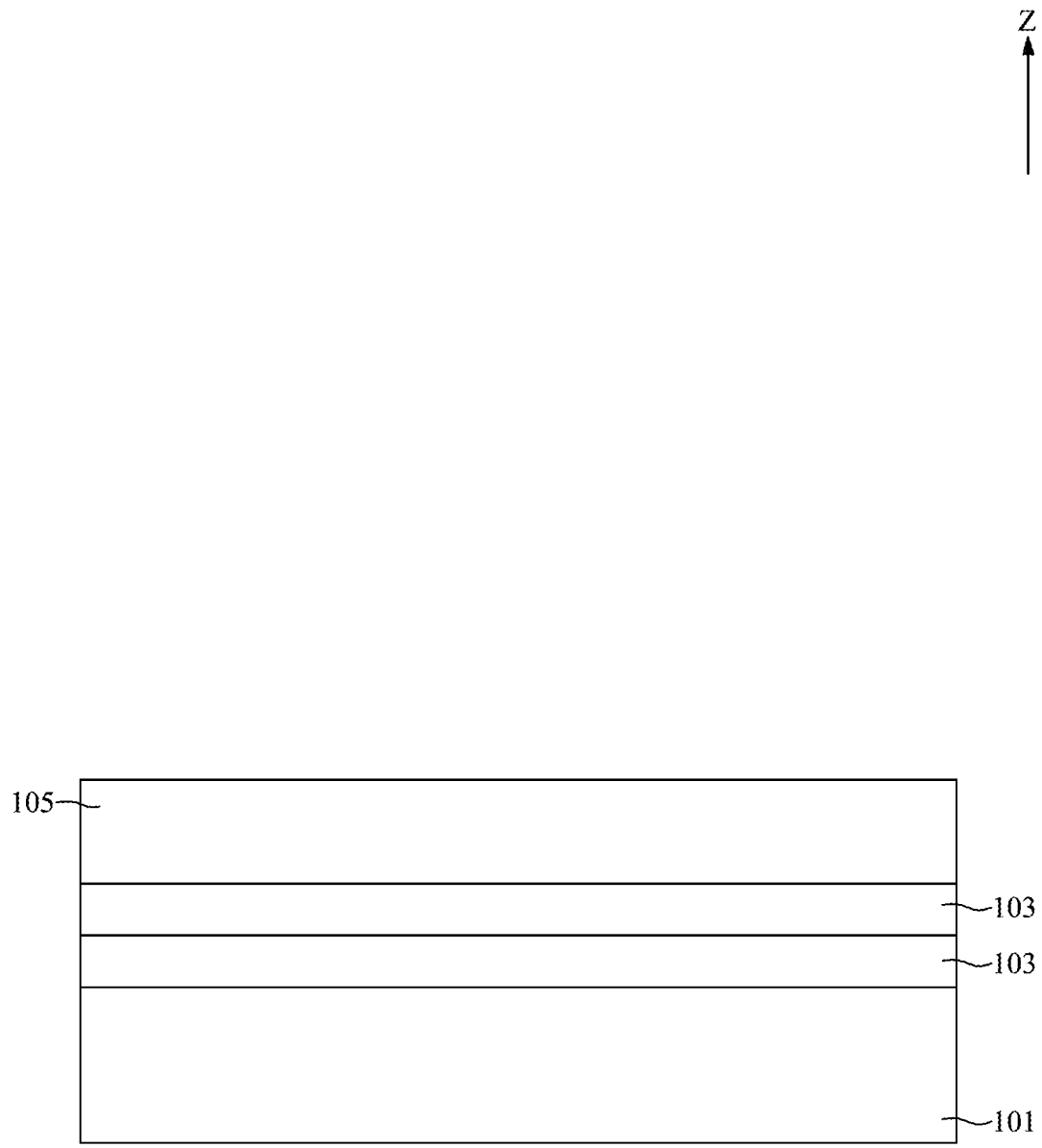
FIGS. 17 to 20 illustrate, in schematic cross-sectional diagrams, part of a flow of fabricating the semiconductor device in accordance with one embodiment of the present disclosure.

With reference to FIGS. 16 and 17, at step S11, in the embodiment depicted, a semiconductor substrate 101 may be provided and a plurality of interconnection films 103 and a first passivation film 105 may be sequentially formed on the semiconductor substrate 101. Elements such as transistors, capacitors, and interconnects may be disposed within the semiconductor substrate 101 (not shown). The plurality of interconnection films 103 may serve to further interconnect the various elements disposed within the semiconductor substrate 101.

Figure 18:
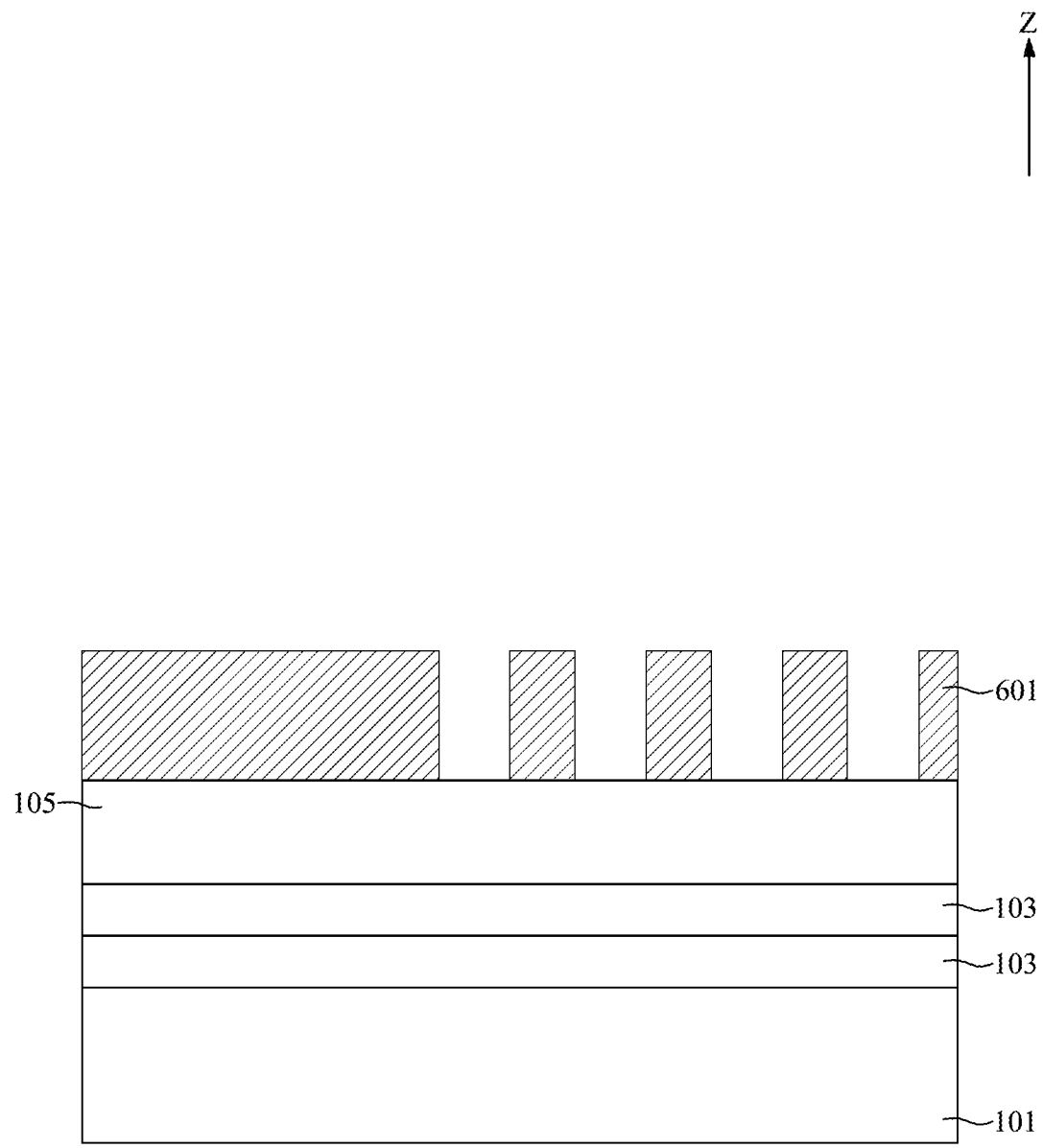
Figure 19:
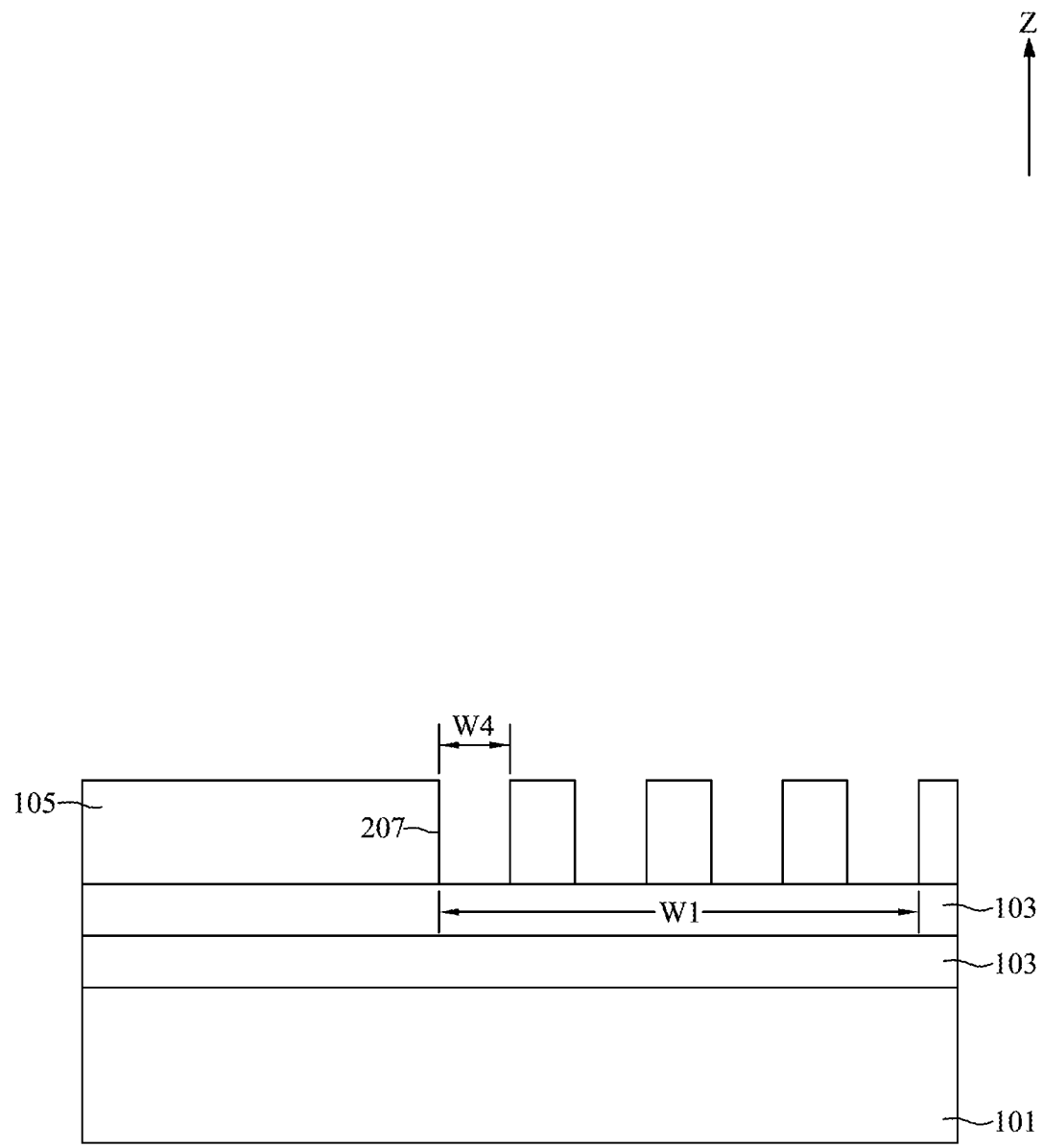

With reference to FIGS. 16 and 18 to 21, at step S13, in the embodiment depicted, a stress-relieving structure 201 may be formed above the semiconductor substrate 101 and in the first passivation film 105. The stress-relieving structure 201 may include a conductive frame 203 and a plurality of insulating pillars 205. With reference to FIG. 18, a photolithography process using a first mask layer 601 as a mask may be performed to define a position of the stress-relieving structure 201 on the first passivation film 105. With reference to FIG. 19, after the photolithography process, an etch process, such as an anisotropic dry etch process, may be performed to form a conductive frame opening 207 in the first passivation film 105. Portions of a top surface of a topmost film of the plurality of interconnection films 103 may be exposed through the conductive frame opening 207. It should be noted that there is no conductive layer exposed through the conductive frame opening 207.

Figure 20:
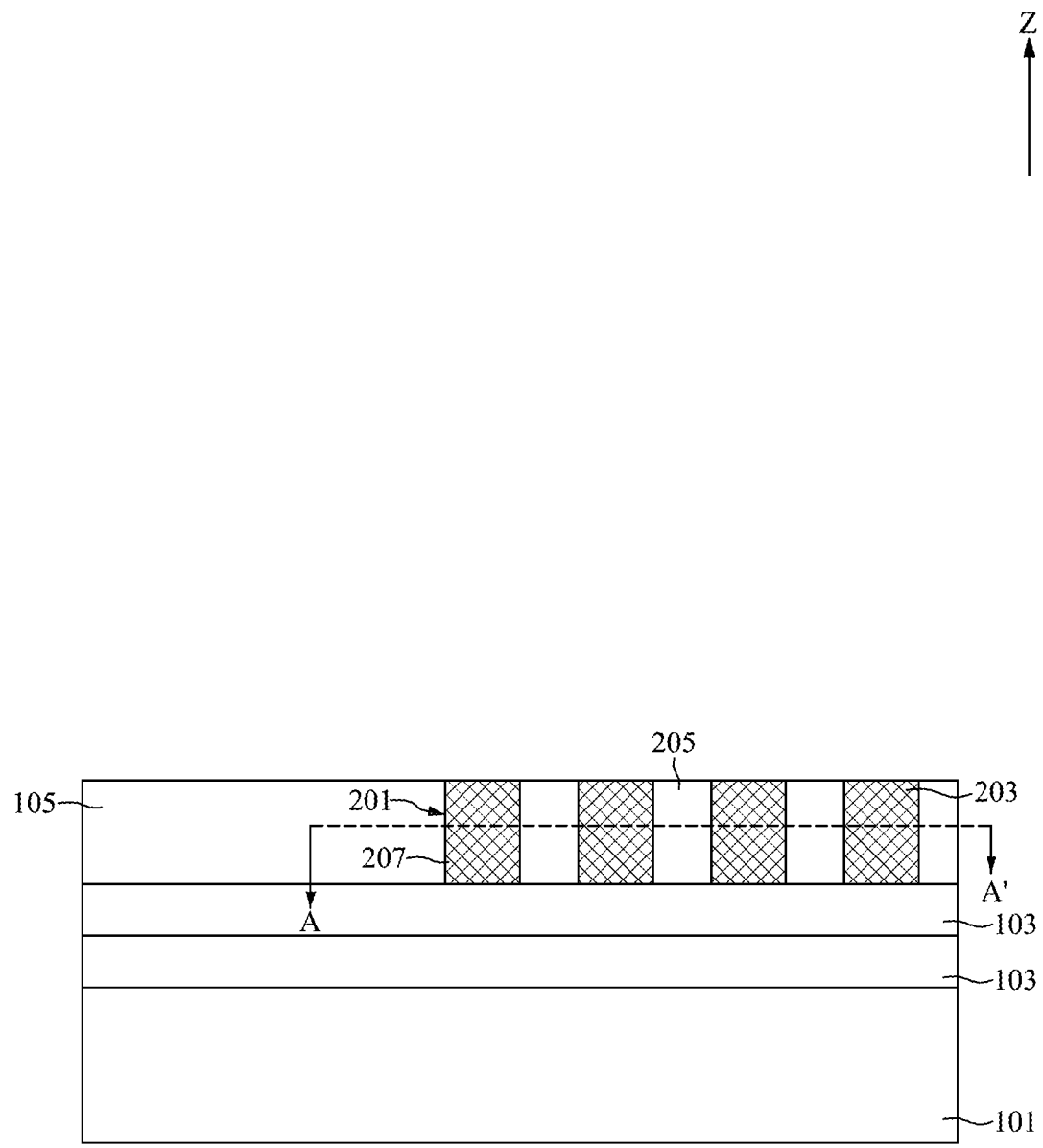
Figure 21:
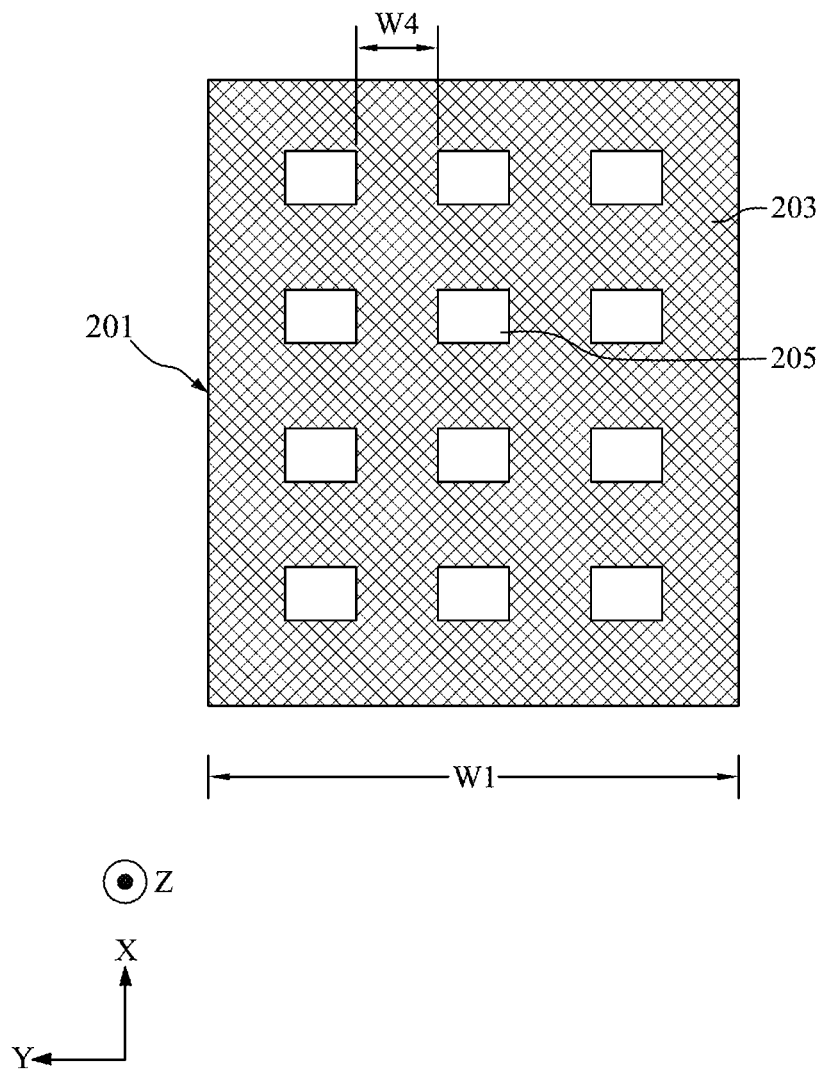
FIG. 21 illustrates, in a schematic cross-sectional view diagram taken along a line A-A' in FIG. 20, part of a flow of fabricating the semiconductor device in accordance with one embodiment of the present disclosure.

With reference to FIGS. 20 and 21, a conductive material, for example, metal, metal nitride, or metal silicide, may be deposited into the conductive frame opening 207 by a metallization process. After the metalization process, a planarization process, such as chemical mechanical polishing, may be performed to remove excess material, provide a substantially flat surface for subsequent processing steps, and conformally form the conductive frame 203 and the plurality of insulating pillars 205. The conductive frame 203 and the plurality of insulating pillars 205 together form the stress-relieving structure 201. The stress-relieving structure 201 may have a first width W1.

Figure 22:
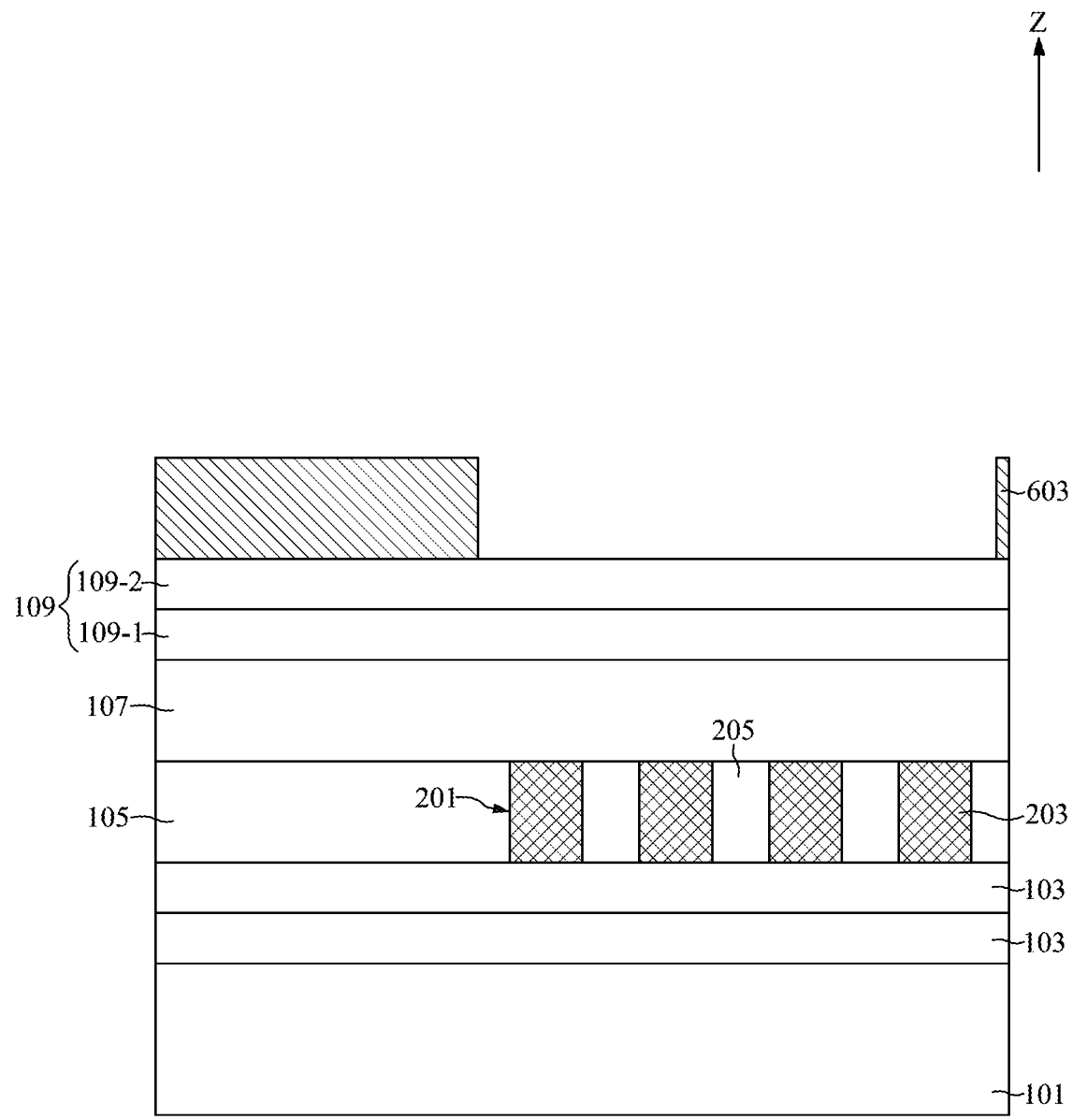
FIGS. 22 to 30 illustrate, in schematic cross-sectional diagrams, part of a flow of fabricating the semiconductor device in accordance with one embodiment of the present disclosure.
Figure 23:
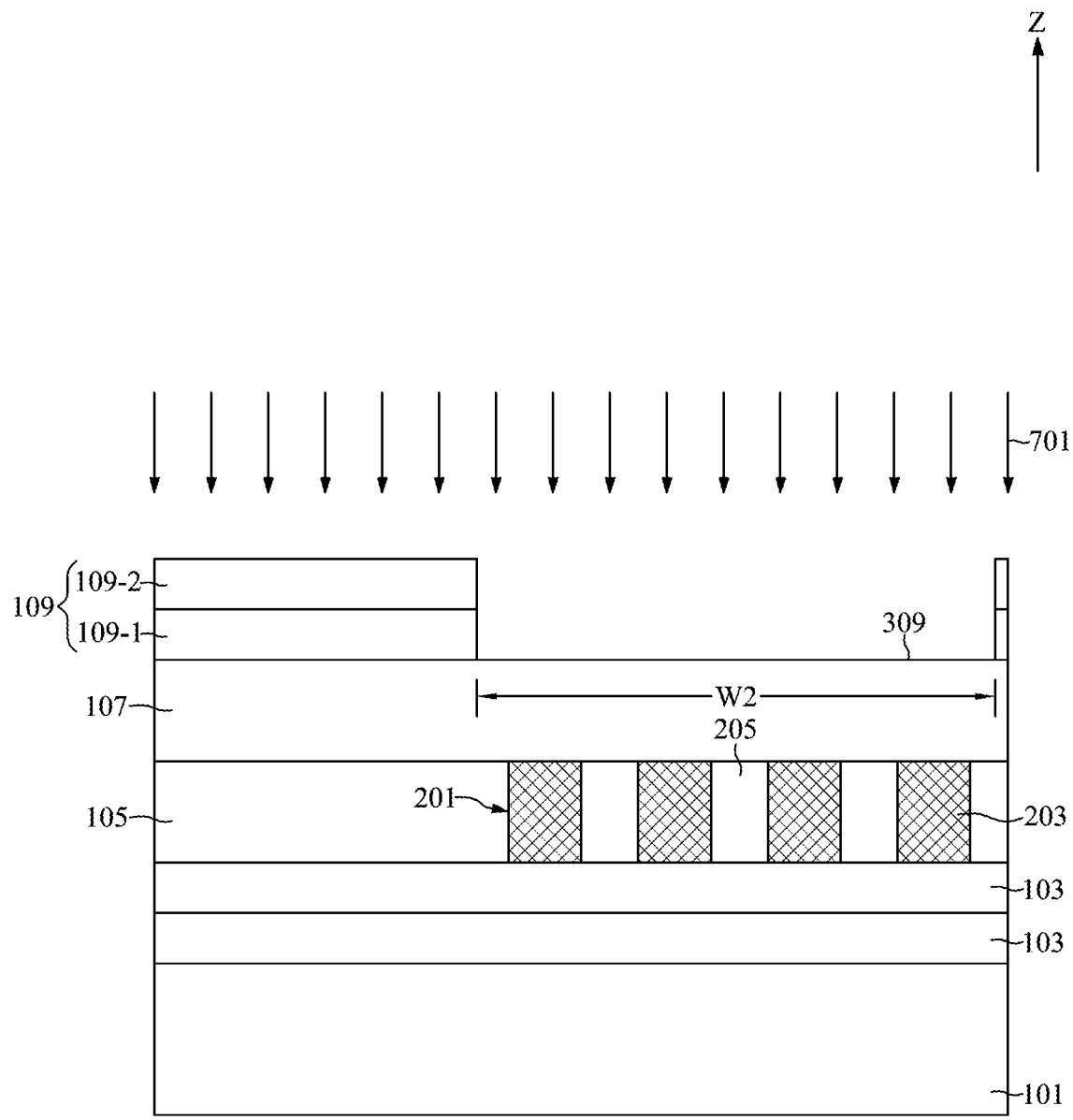

With reference to FIGS. 16 and 22 to 25, at step S15, in the embodiment depicted, a bonding pad structure 301 may be formed above the stress-relieving structure 201. The bonding pad structure 301 may include a bottom bonding pad 303 and a top bonding pad 305. With reference to FIG. 22, a third bottom passivation film 109-1 and a third top passivation film 109-2 may be sequentially formed on the second passivation film 107 by deposition processes. The third bottom passivation film 109-1 and the third top passivation film 109-2 together form a third passivation film 109. A photolithography process using a second mask layer 603 as a mask may be performed to define a position of the bonding pad structure 301 on the third top passivation film 109-2. With reference to FIG. 23, after the photolithography process, an etch process, such as an anisotropic dry etch process, may be performed to form a bonding pad opening 309 so as to penetrate the third top passivation film 109-2 and the third bottom passivation film 109-1. A portion of a top surface of the second passivation film 107 may be exposed through the bonding pad opening 309. The bonding pad opening 309 may be formed above the stress-relieving structure 201 and have a second width W2. The second width W2 of the bonding pad opening 309 may be greater than the first width W1 of the stress-relieving structure 201.

With reference to FIG. 23, a cleaning process 701 may be performed after the aforementioned etch process. The cleaning process 701 may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process 701. The bias energy may be between about 0 W and 200 W. The cleaning process 701 may remove oxide, originating from oxidation by oxygen in the air, from a top surface of a conductive layer exposed through the bonding pad opening 309 without damaging the conductive feature of the aforementioned conductive layer.

Figure 24:
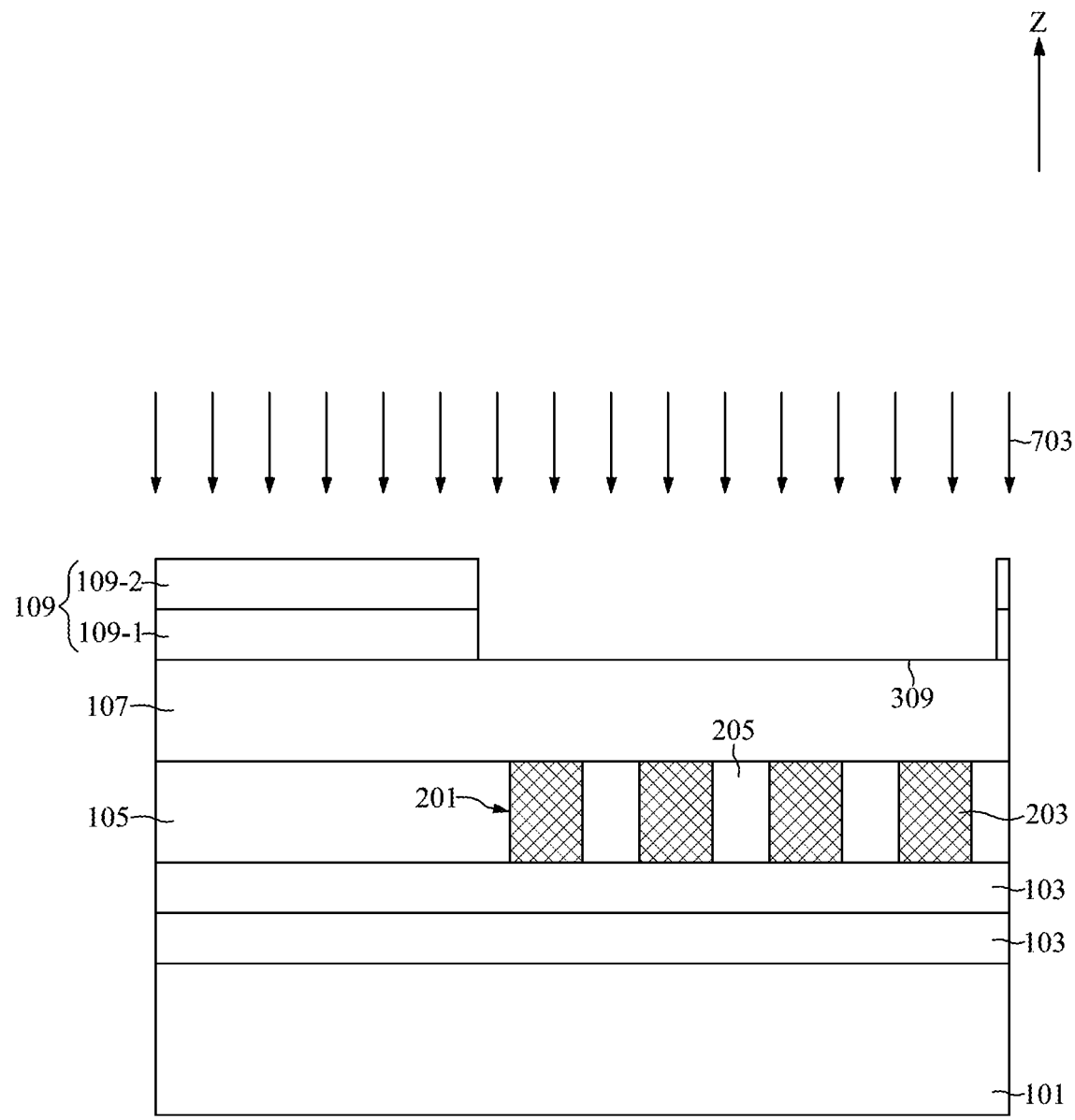
Figure 25:
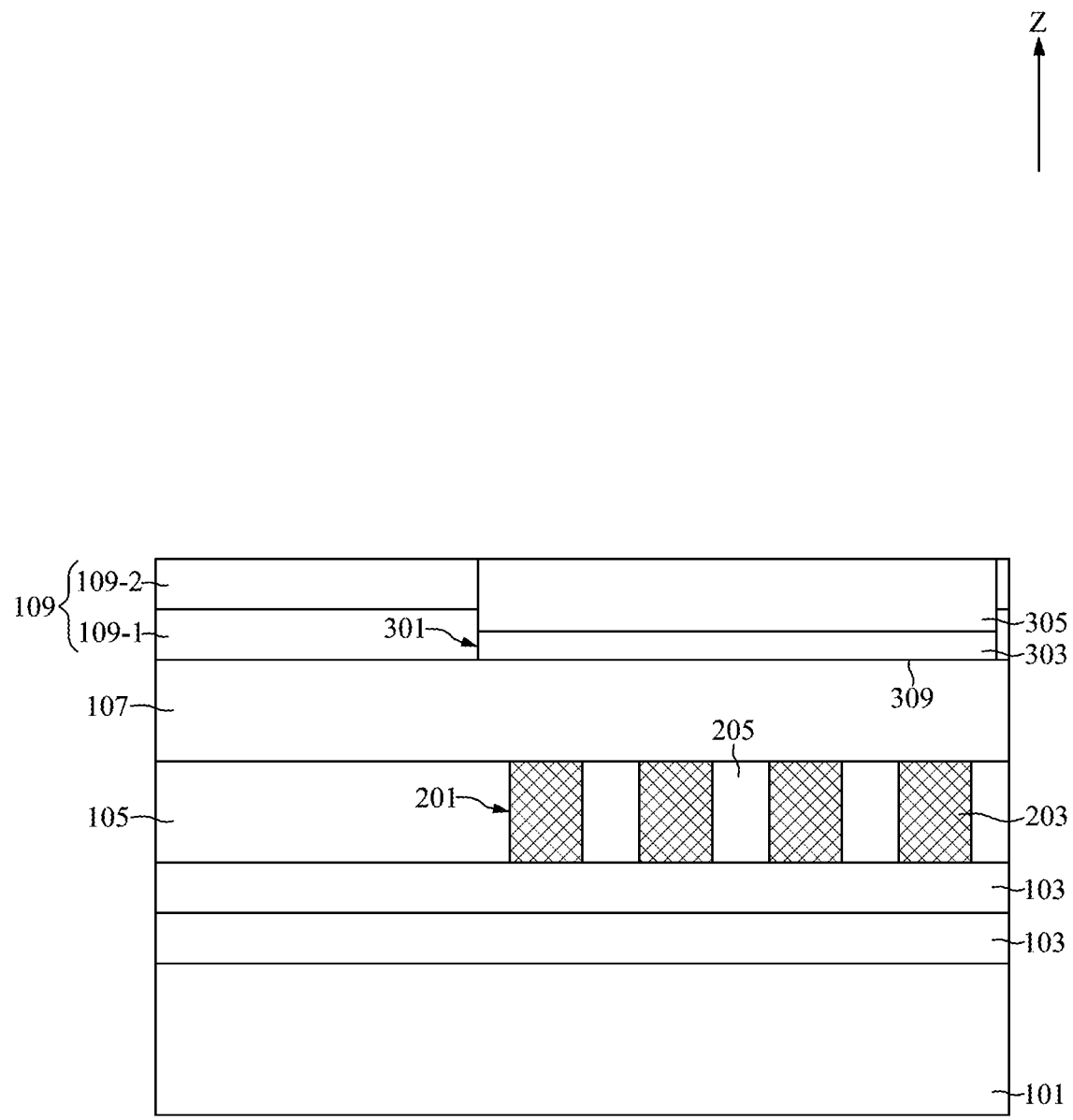

With reference to FIG. 24, a passivation process 703 may be performed over the third top passivation film 109-2 and the bonding pad opening 309. The passivation process 703 may include soaking the semiconductor device with a precursor such as dimethylaminotrimethylsilane, tetramethylsilane, or the like at a process temperature between about 200° C. and about 400° C. An ultraviolet radiation may be used to facilitate the passivation process 703. The passivation process 703 may passivate sidewalls of the third bottom passivation film 109-1 and the third top passivation film 109-2 exposed through the bonding pad opening 309 by sealing surface pores thereof to reduce undesirable sidewall growth, which may affect the electric characteristics of the semiconductor device 100A, during subsequent processing steps. As a result, the performance and reliability of the semiconductor device 100A may be increased. With reference to FIG. 25, the bottom bonding pad 303 and the top bonding pad 305 may be sequentially formed in the bonding pad opening 309 by electroplating or electroless plating. A planarization process, such as chemical mechanical polishing, may be optionally performed to provide a substantially flat surface for subsequent processing steps.

Figure 26:
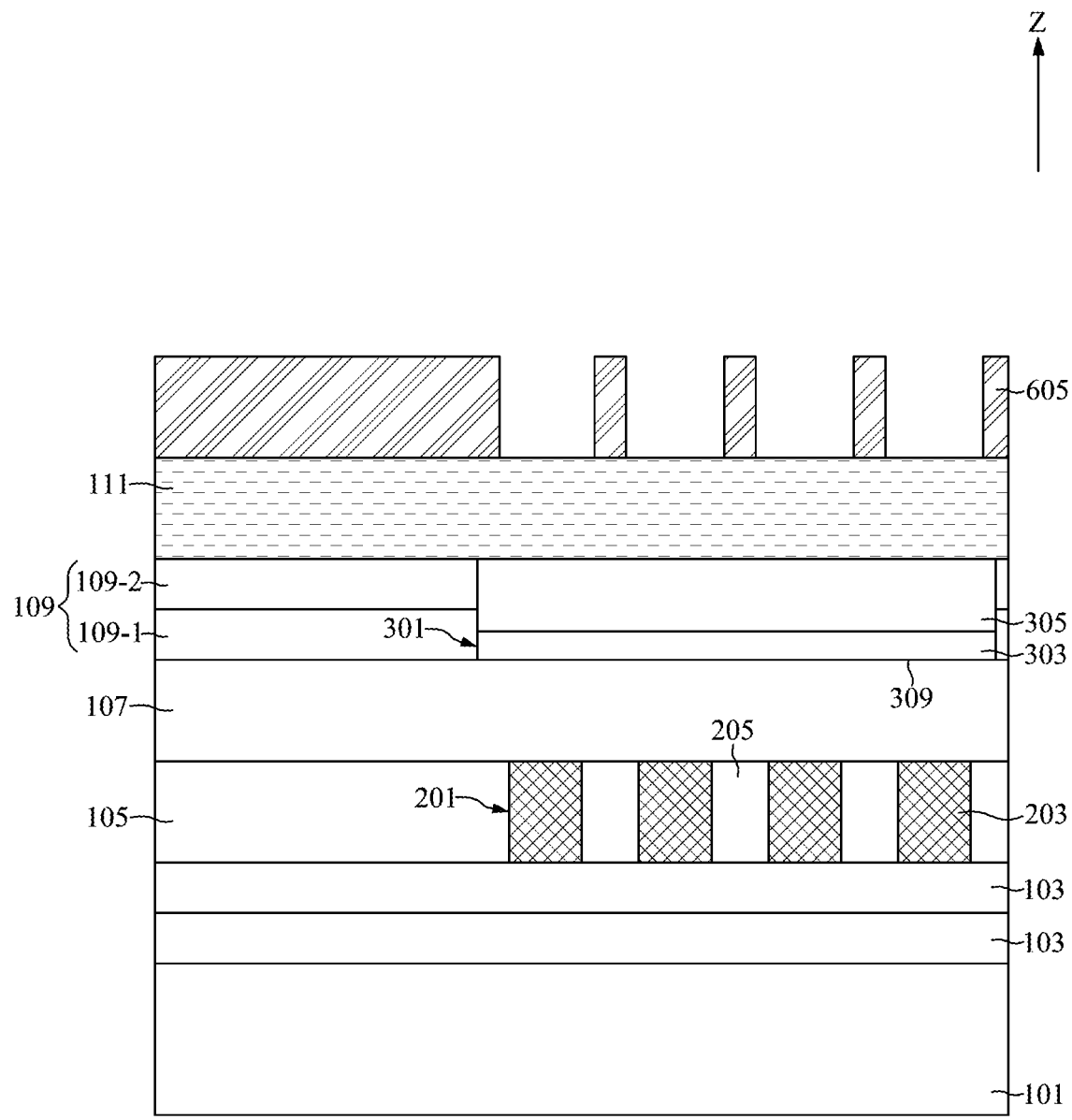

With reference to FIGS. 16 and 26 to 30, at step S17, in the embodiment depicted, a conductive structure 401 may be formed on the bonding pad structure 301. The conductive structure 401 may include an upper conductive portion 403 and a patterned structure. The patterned structure may include a supporting portion 405, a conductive portion 407, and a plurality of spacers 409. With reference to FIG. 26, a fourth passivation film 111 may be formed on the third top passivation film 109-2 and the bonding pad structure 301. A photolithography process using a third mask layer 605 as a mask may be performed to define a position of the patterned structure on the fourth passivation film 111.

Figure 27:
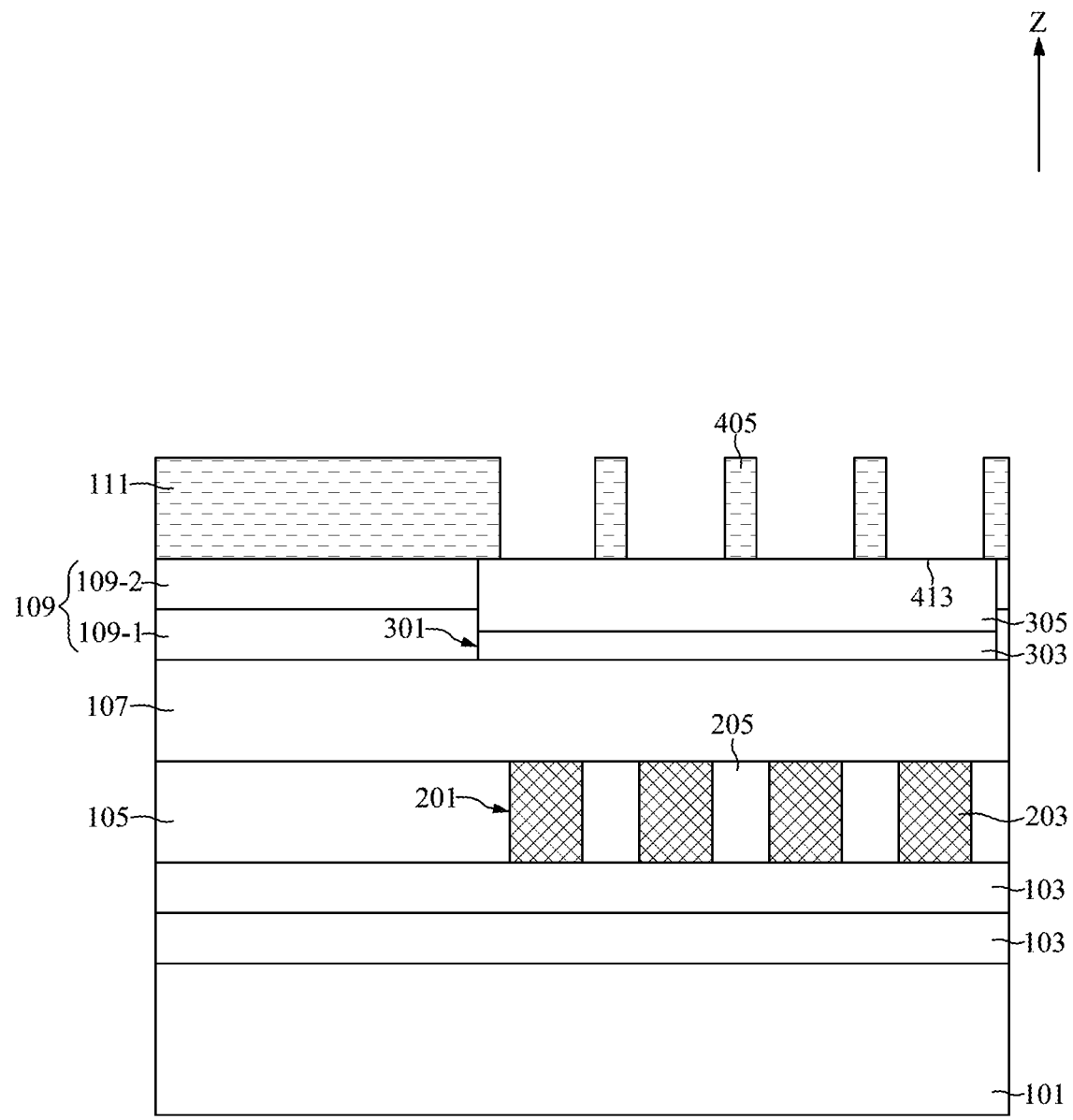
Figure 28:
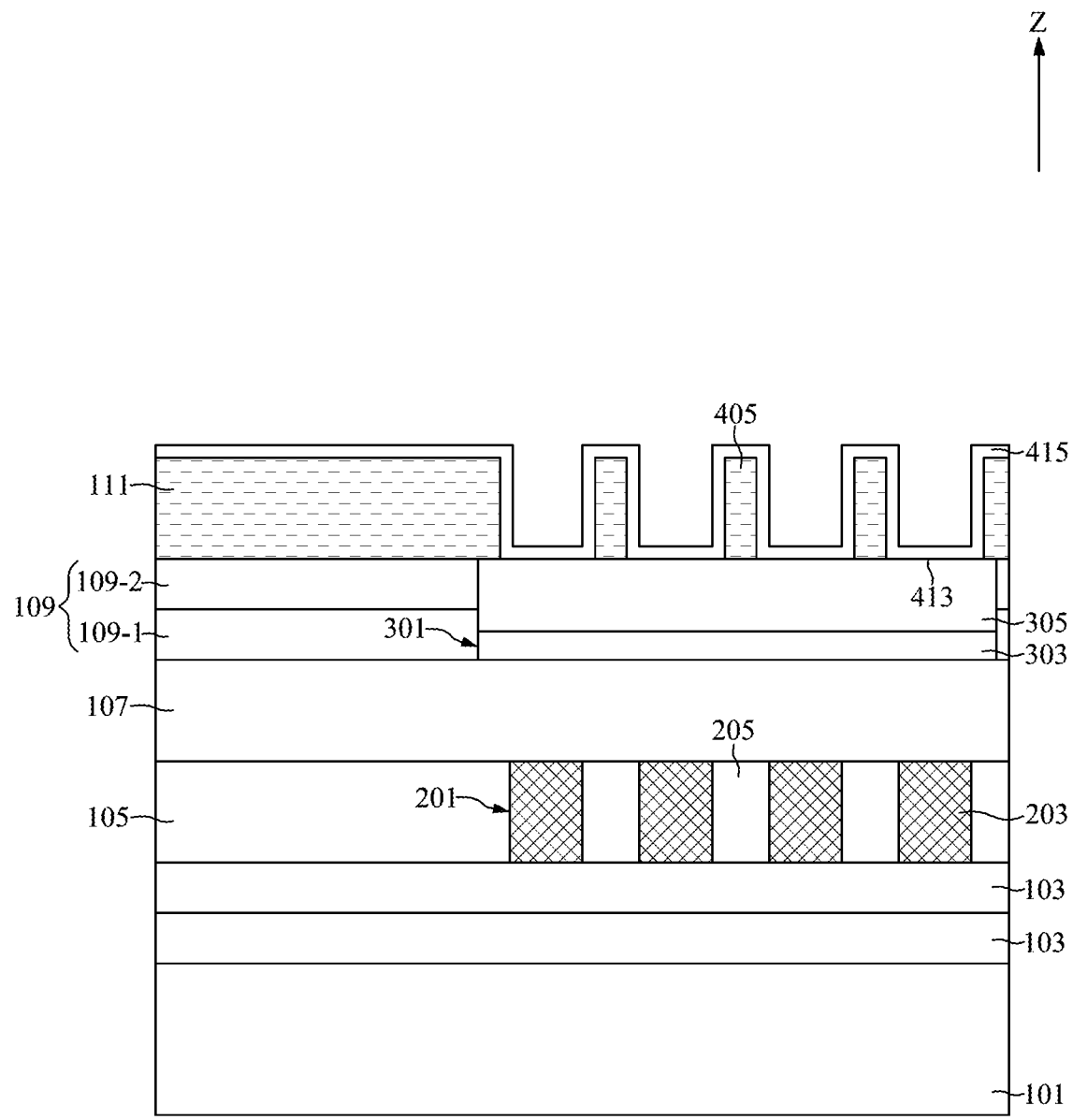

With reference to FIG. 27, after the photolithography process, an etch process, such as an anisotropic dry etch process, may be performed to form a plurality of conductive portion recesses 413 in the fourth passivation film 111. Portions of a top surface of the top bonding pad 305 may be exposed through the plurality of conductive portion recesses 413. After the etch process, portions of the fourth passivation film 111 may be turned into the supporting portion 405. With reference to FIG. 28, a spacer layer 415 may be formed to cover a top surface of the fourth passivation film 111, a top surface of the supporting portion 405, and sidewalls and bottoms of the plurality of conductive portion recesses 413. The spacer layer 415 may be formed of, for example, silicon oxide, silicon nitride, silicon oxynitride, or silicon oxide nitride.

Figure 29:
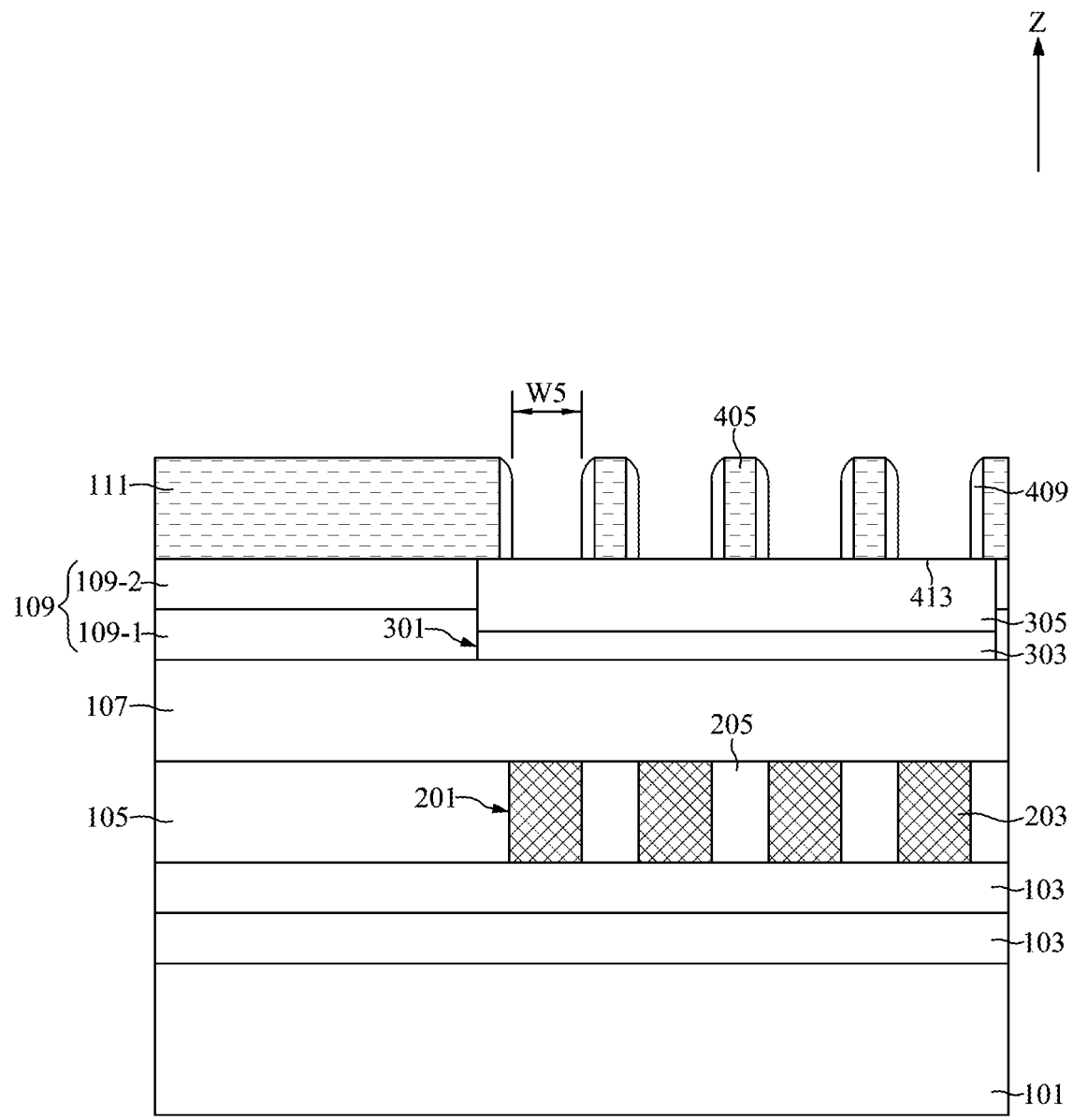
Figure 30:
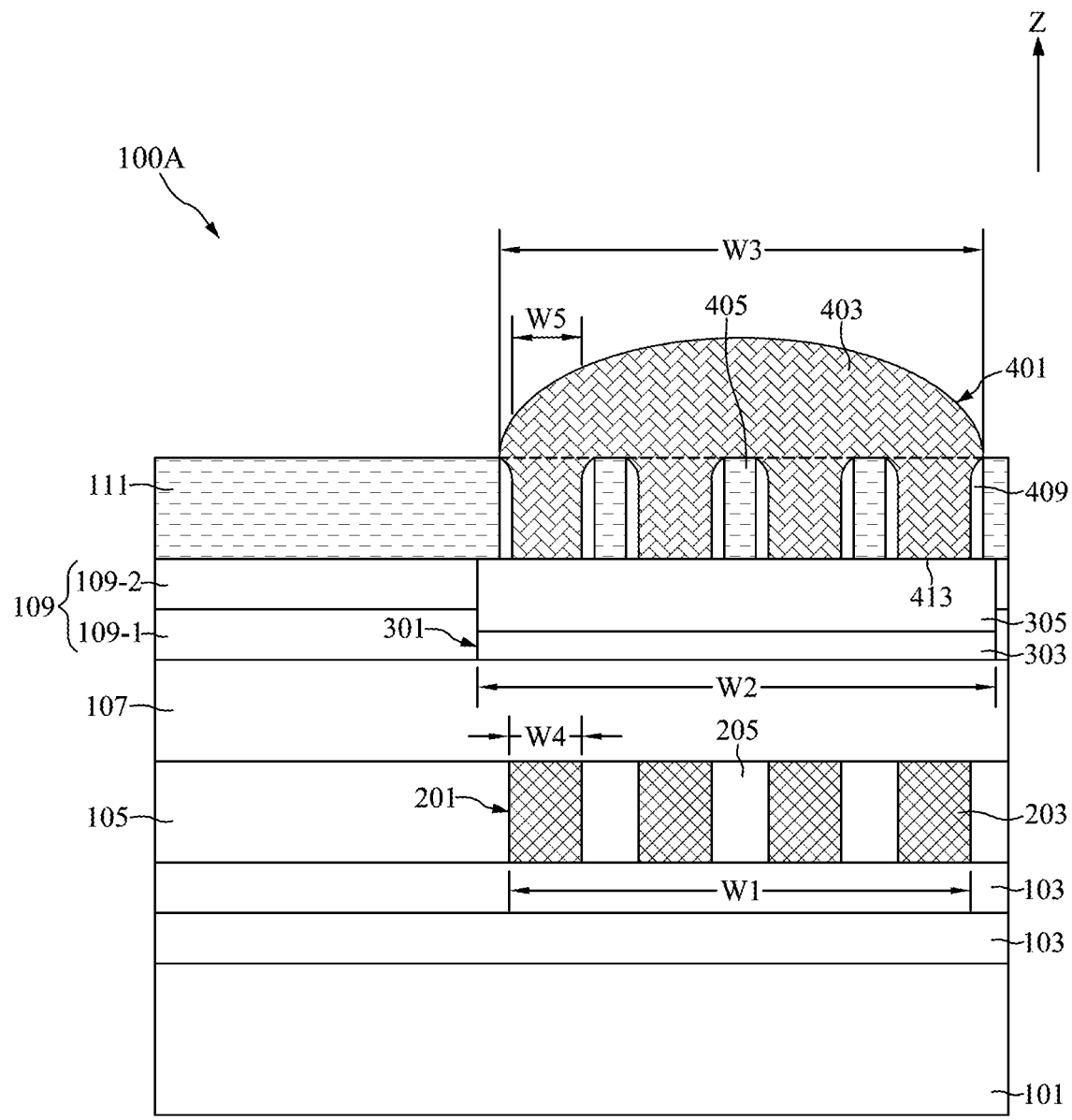

With reference to FIG. 29, an etch process, such as an anisotropic dry etch process, may be performed to remove portions of the spacer layer 415 and concurrently form the plurality of spacers 409. The plurality of spacers 409 may be formed so as to be attached to sidewalls of the plurality of conductive portion recesses 413. With reference to FIG. 30, the conductive portion 407 and the upper conductive portion 403 may concurrently be formed by a process such as chemical vapor deposition, physical vapor deposition, atomic layer deposition, plasma enhanced chemical vapor deposition, electroplating, or electroless plating. The conductive portion 407 may be formed to fill the plurality of conductive portion recesses 413. The upper conductive portion 403 may be formed on the supporting portion 405 and the conductive portion 407.

Figure 31:
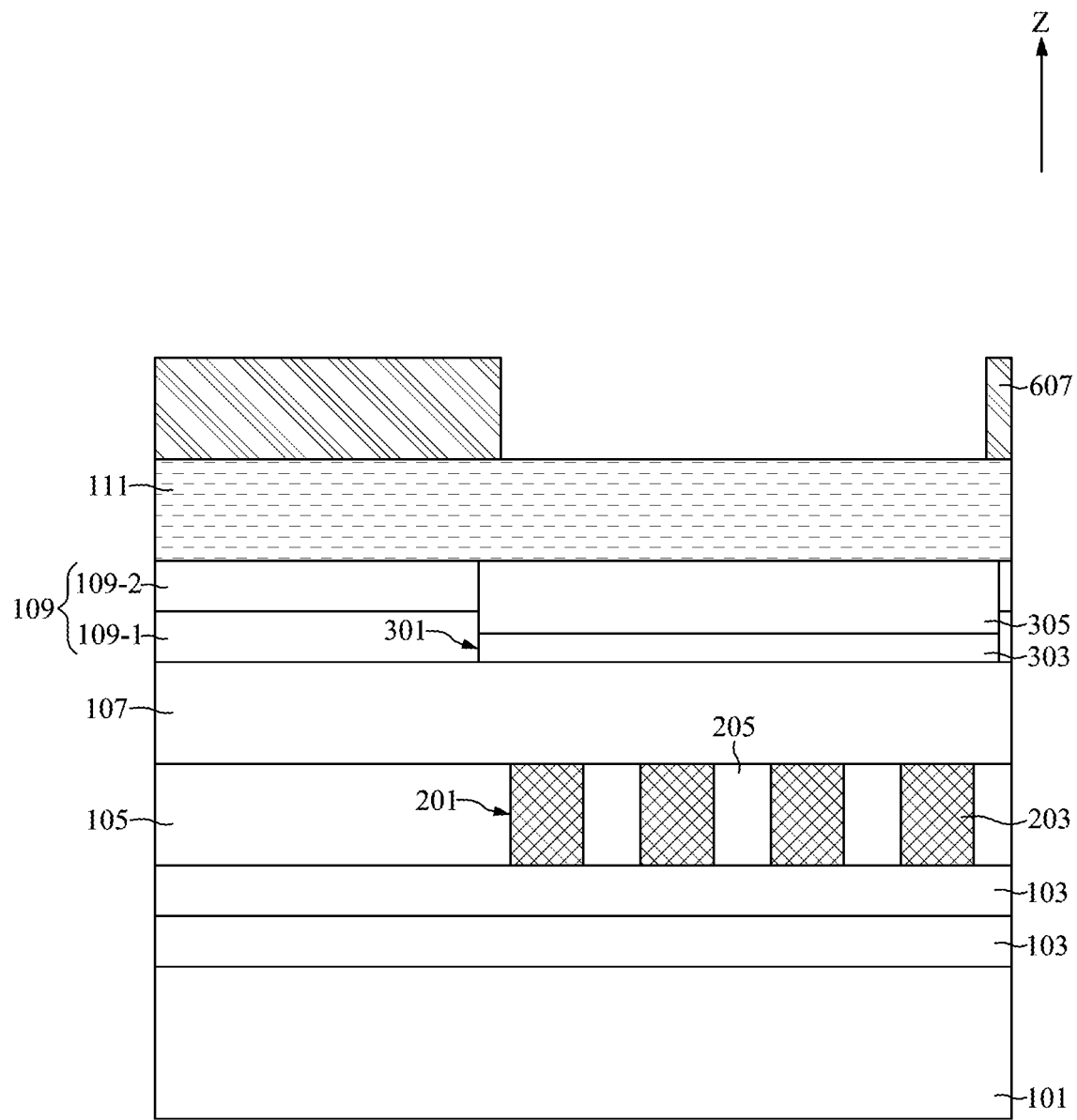
FIGS. 31 to 45 illustrate, in schematic cross-sectional diagrams, flows of fabricating semiconductor devices in accordance with other embodiments of the present disclosure.
Figure 32:
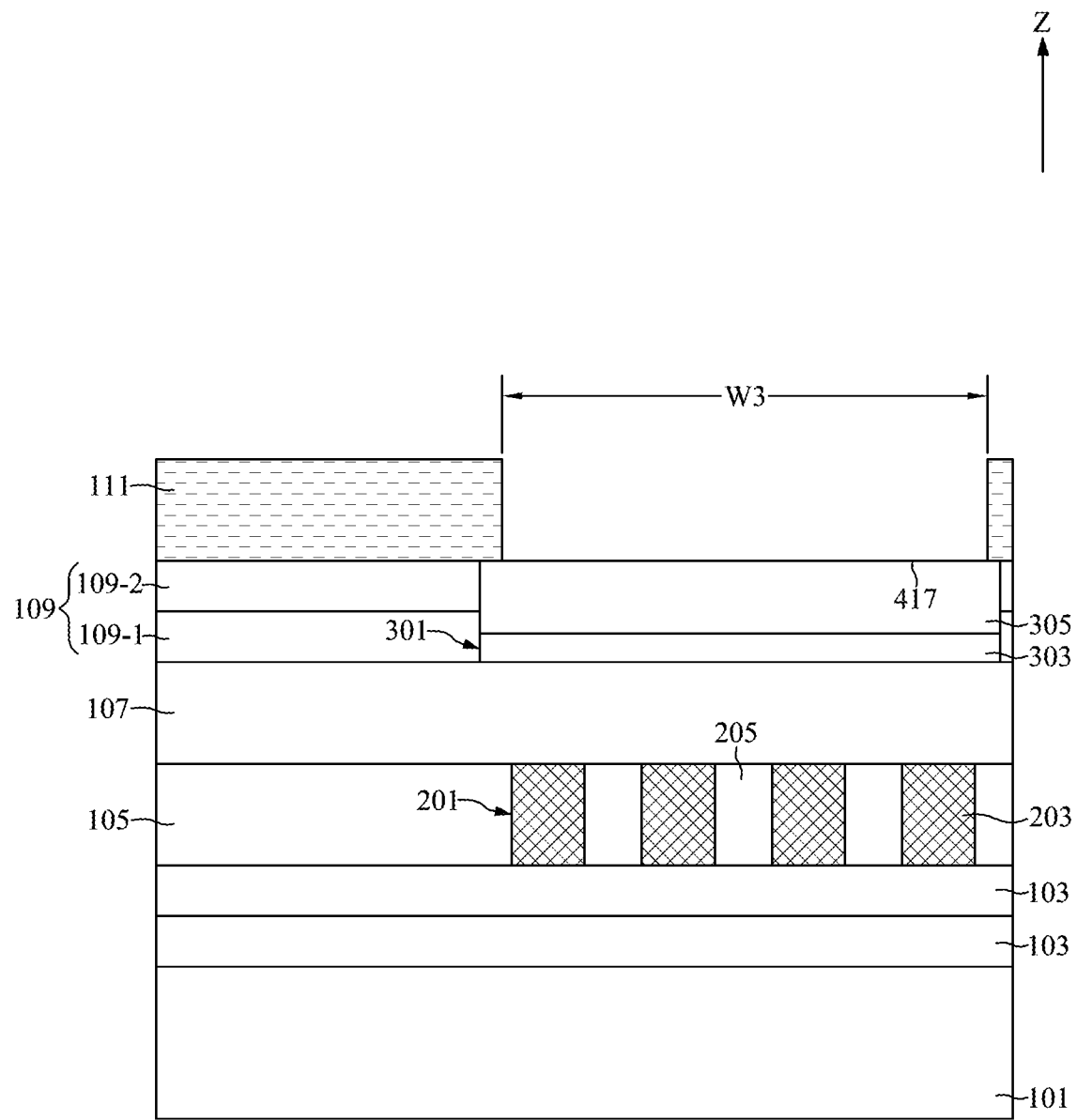
Figure 33:
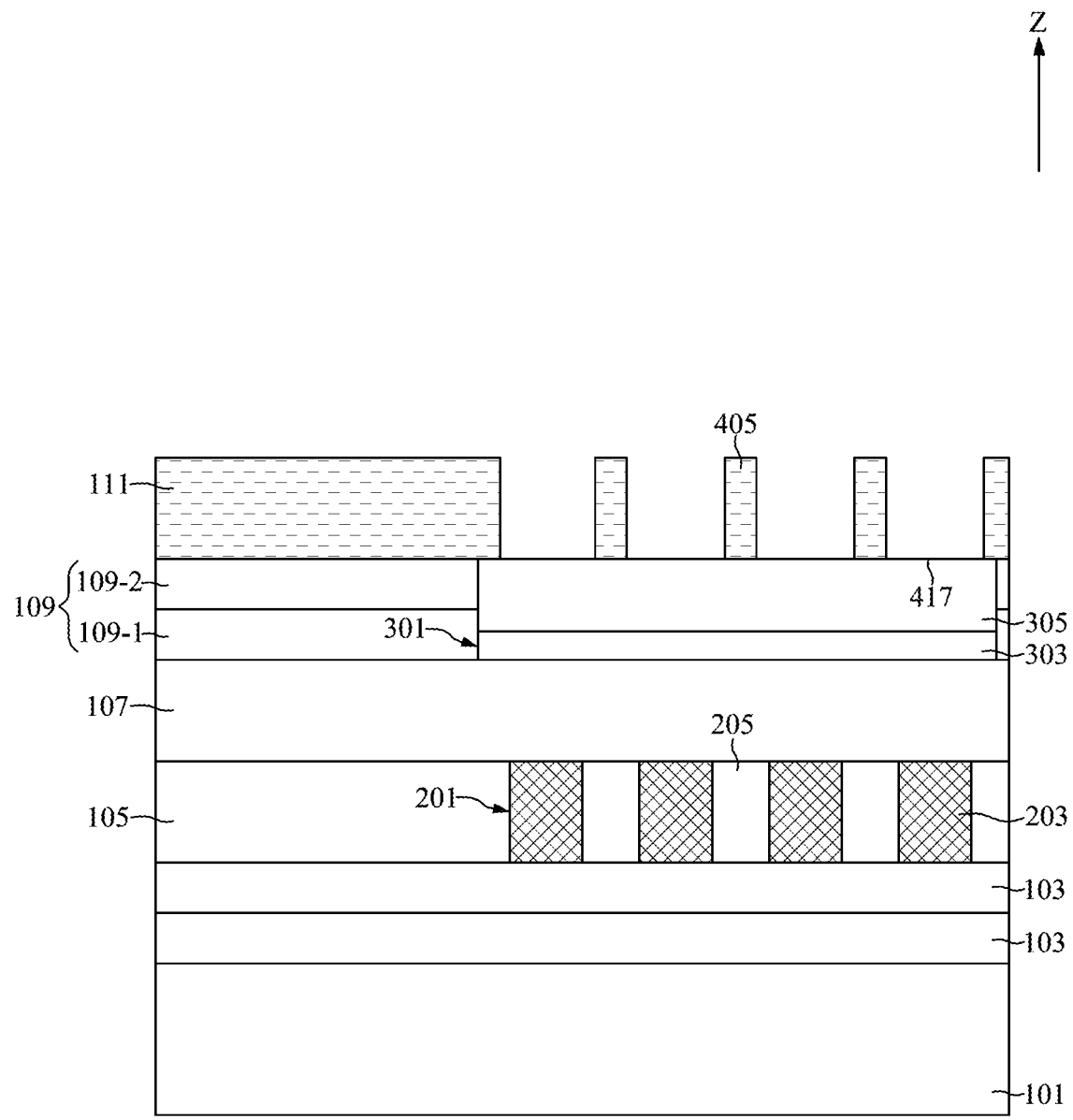

FIGS. 31 to 33 illustrate, in schematic cross-sectional diagrams, part of a flow of fabricating a semiconductor device in accordance with another embodiment of the present disclosure.

With reference to FIG. 31, an intermediate semiconductor device may be fabricated by a procedure similar to that illustrated in FIGS. 17 to 26. A photolithography process using a fourth mask layer 607 as a mask may be performed to define the position of the patterned structure. With reference to FIG. 32, after the photolithography process, an etch process, such as an anisotropic dry etch process, may be performed to form a conductive structure opening 417. The conductive structure opening 417 may have a third width W3. A horizontal cross-sectional profile may be polygonal, circular, or oval. With reference to FIG. 33, the supporting portion 405 may be formed in the conductive structure opening 417. The other portions of the semiconductor device may be sequentially formed by a procedure similar to that illustrated in FIGS. 28 to 30.

Figure 34:
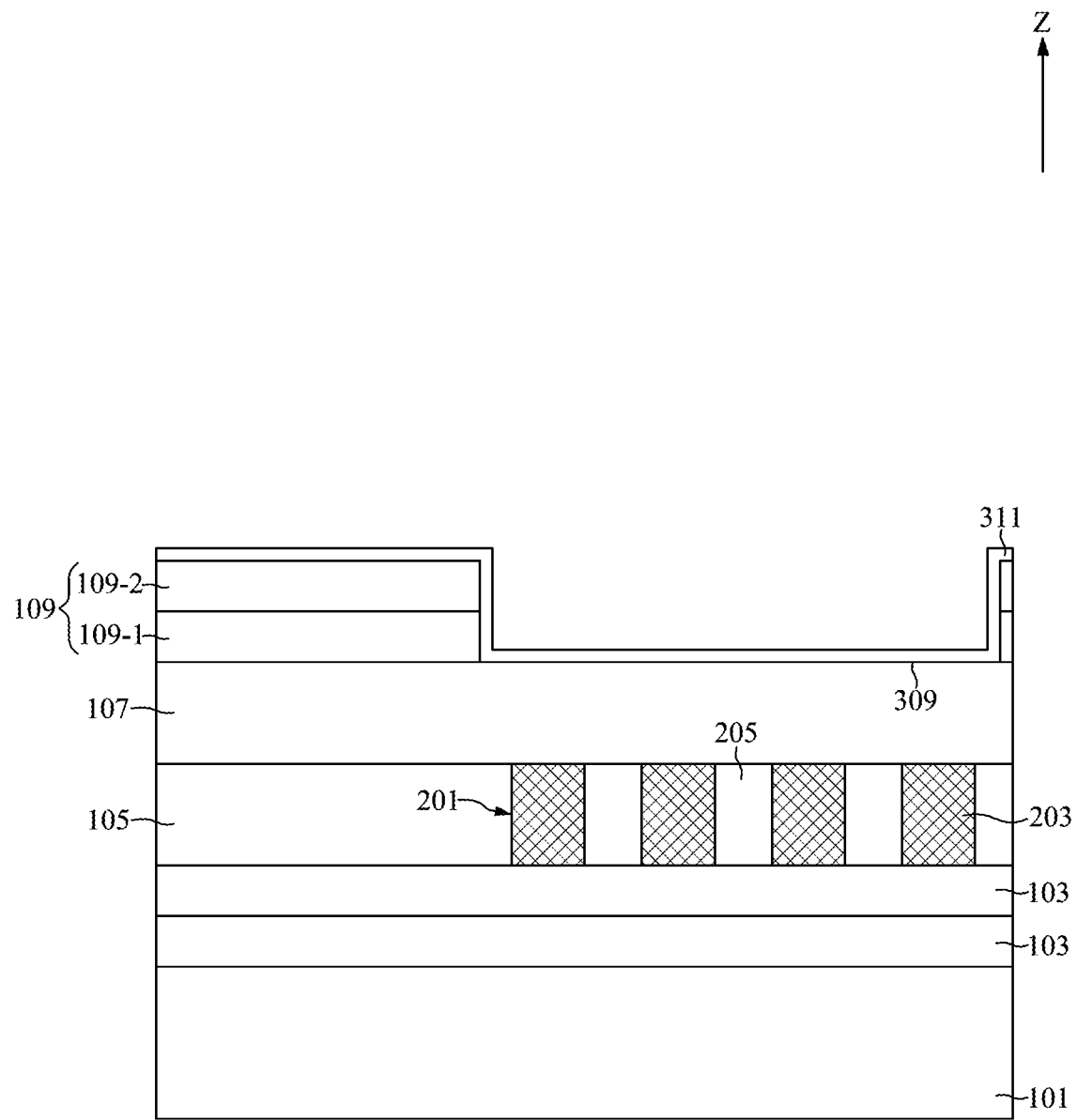
Figure 35:
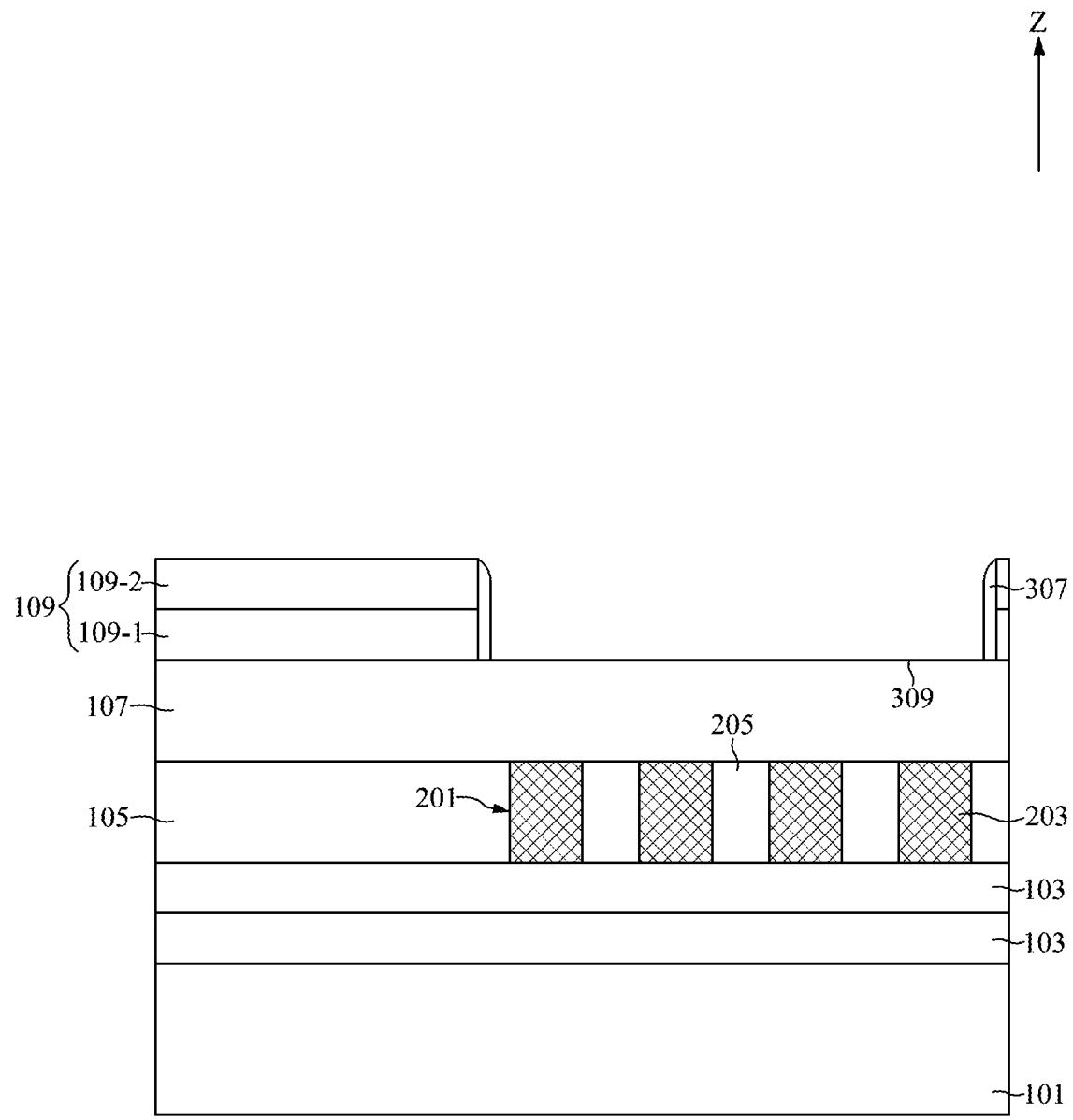
Figure 36:
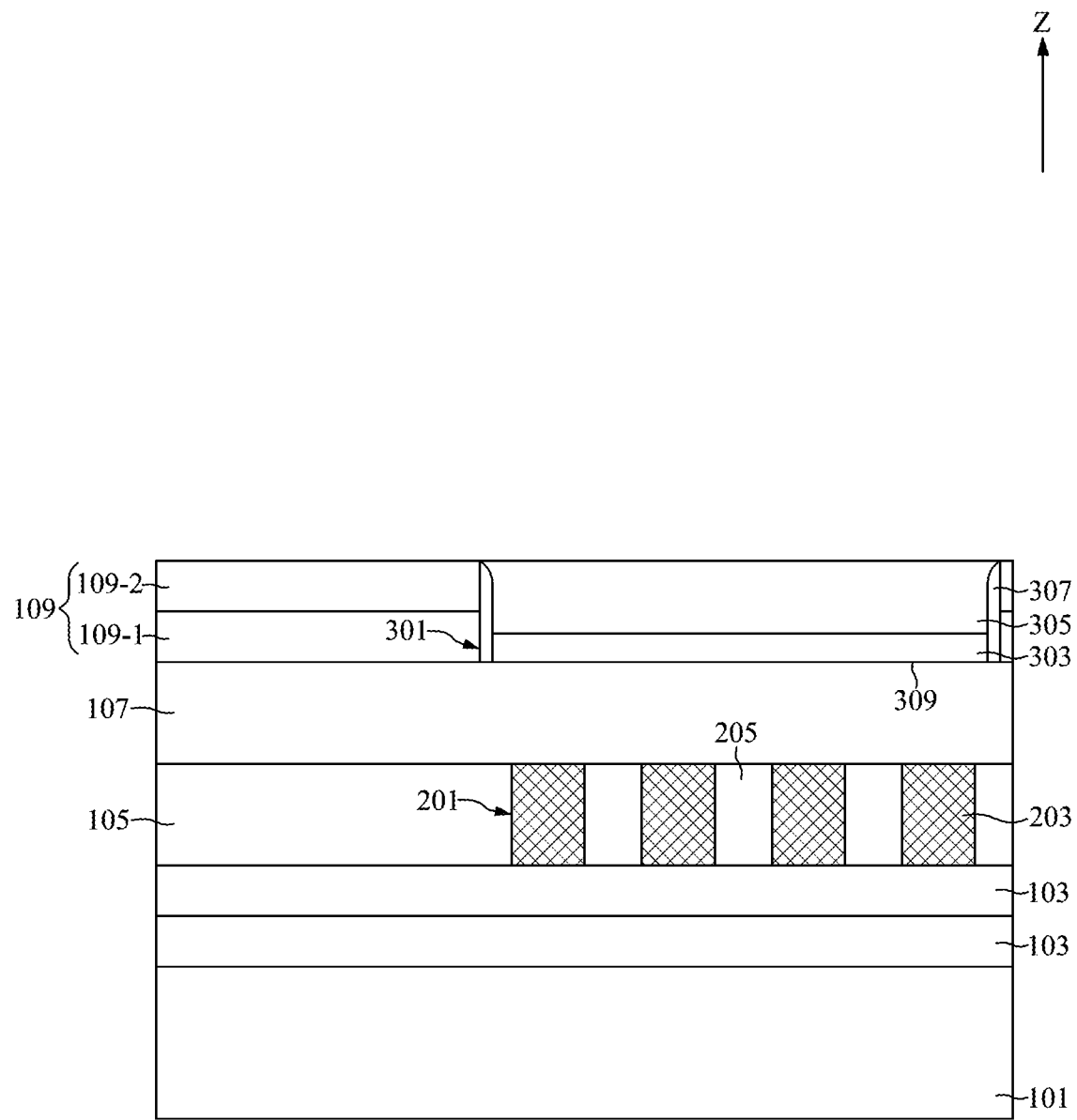

FIGS. 34 to 36 illustrate, in schematic cross-sectional diagrams, part of a flow of fabricating a semiconductor device in accordance with another embodiment of the present disclosure.

With reference to FIG. 34, an intermediate semiconductor device may be fabricated by a procedure similar to that illustrated in FIGS. 17 to 23. A pad spacer layer 311 may be formed to cover the top surface of the third top passivation film 109-2 and sidewalls and a bottom of the bonding pad opening 309. With reference to FIG. 35, an etch process, such as an anisotropic dry etch process, may be performed to remove portions of the pad spacer layer 311 and concurrently form the pair of pad spacers 307 attached to sidewalls of the bonding pad opening 309. With reference to FIG. 36, the bottom bonding pad 303 and the top bonding pad 305 may be sequentially formed in the bonding pad opening 309 and between the pair of pad spacers 307. The other portions of the semiconductor device may be sequentially formed by a procedure similar to that illustrated in FIGS. 25 to 30.

Figure 37:
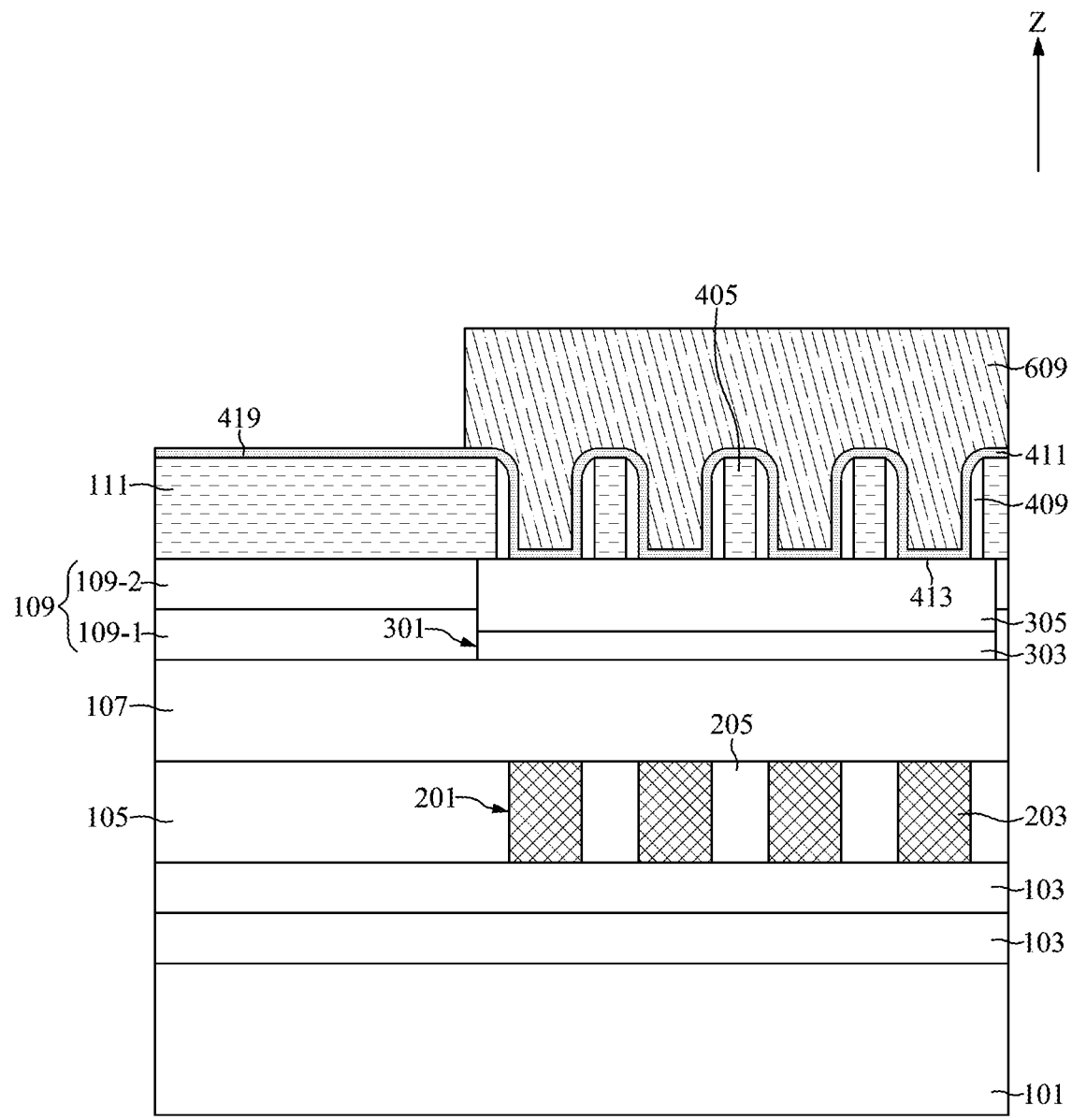
Figure 38:
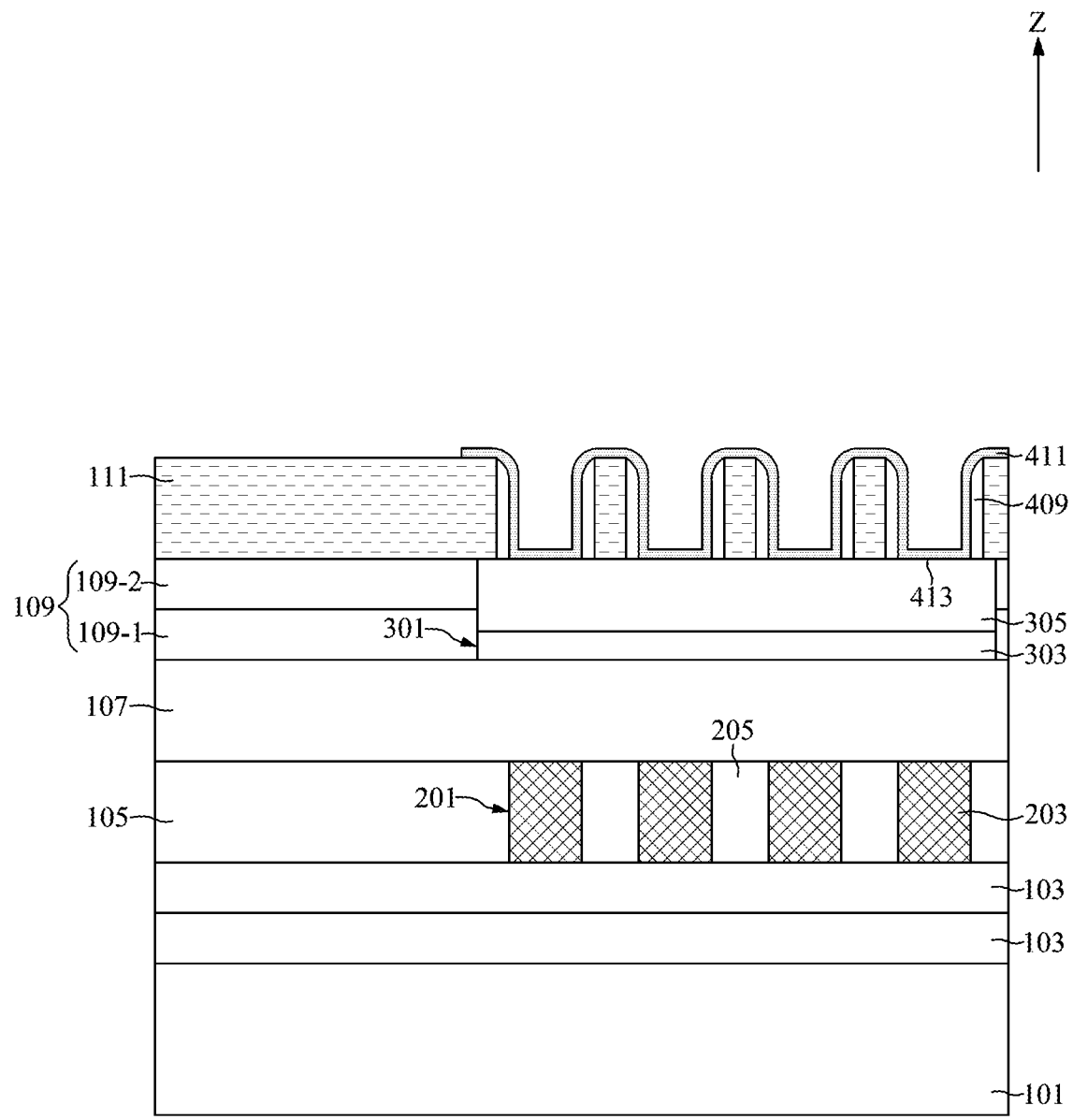

FIGS. 37 and 38 illustrate, in schematic cross-sectional diagrams, part of a flow of fabricating a semiconductor device in accordance with another embodiment of the present disclosure.

With reference to FIG. 37, an intermediate semiconductor device may be fabricated by a procedure similar to that illustrated in FIGS. 17 to 29. A conductive covering layer 419 may be formed to cover the top surface of the fourth passivation film 111, the plurality of spacers 409, the top surface of the supporting portion 405, and the portions of the top surface of the top bonding pad 305. A photolithography process using a fifth mask layer 609 as a mask may be performed to define a position of the conductive covering film 411. With reference to FIG. 38, an etch process, such as an anisotropic dry etch process, may be performed to remove portions of the conductive covering layer 419 and concurrently form the conductive covering film 411. The other portions of the semiconductor device may be sequentially formed by a procedure similar to that illustrated in FIG. 30.

FIGS. 39 to 45 illustrate, in schematic cross-sectional diagrams, part of a flow of fabricating a semiconductor device in accordance with another embodiment of the present disclosure.

Figure 39:
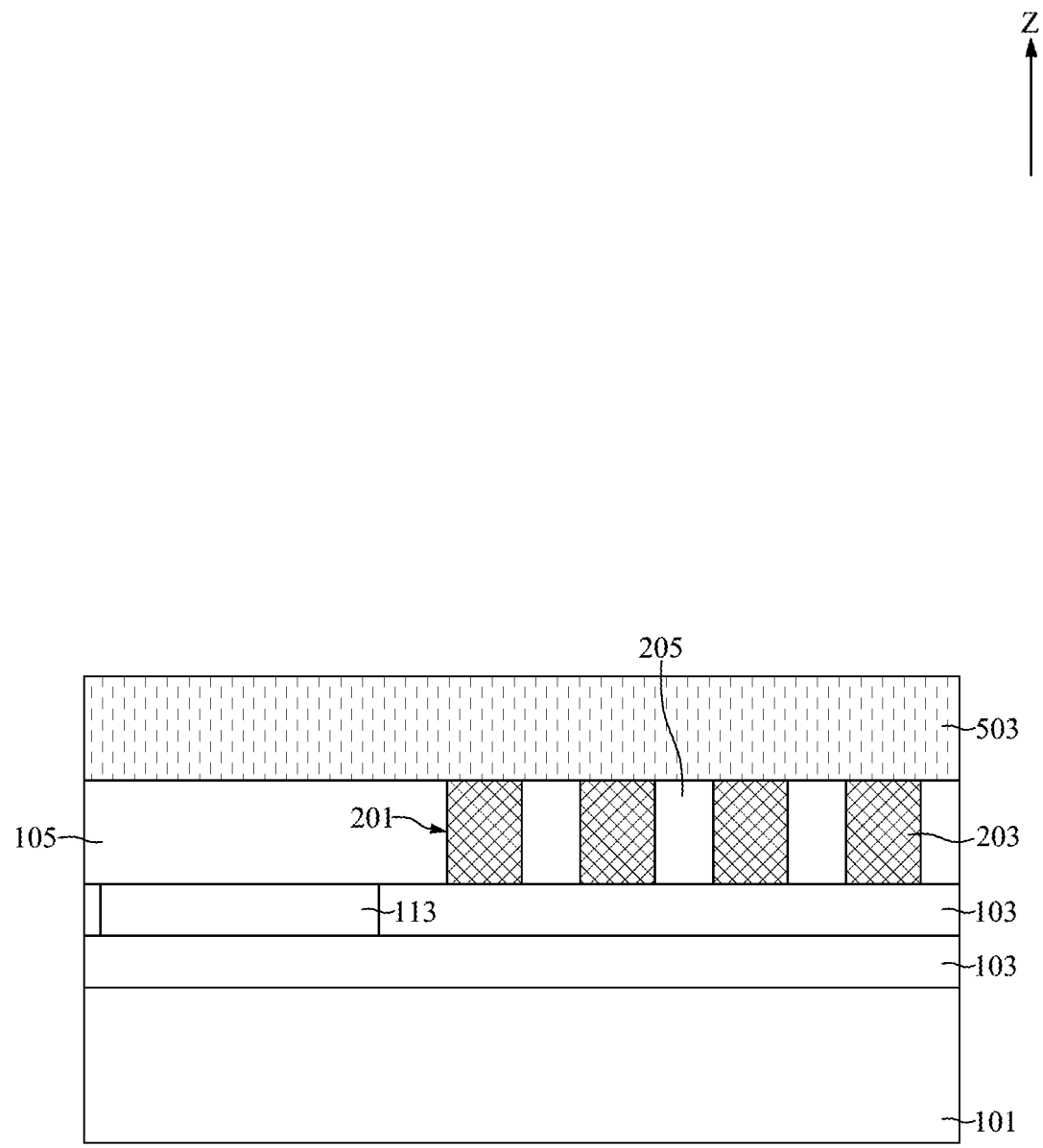
Figure 40:
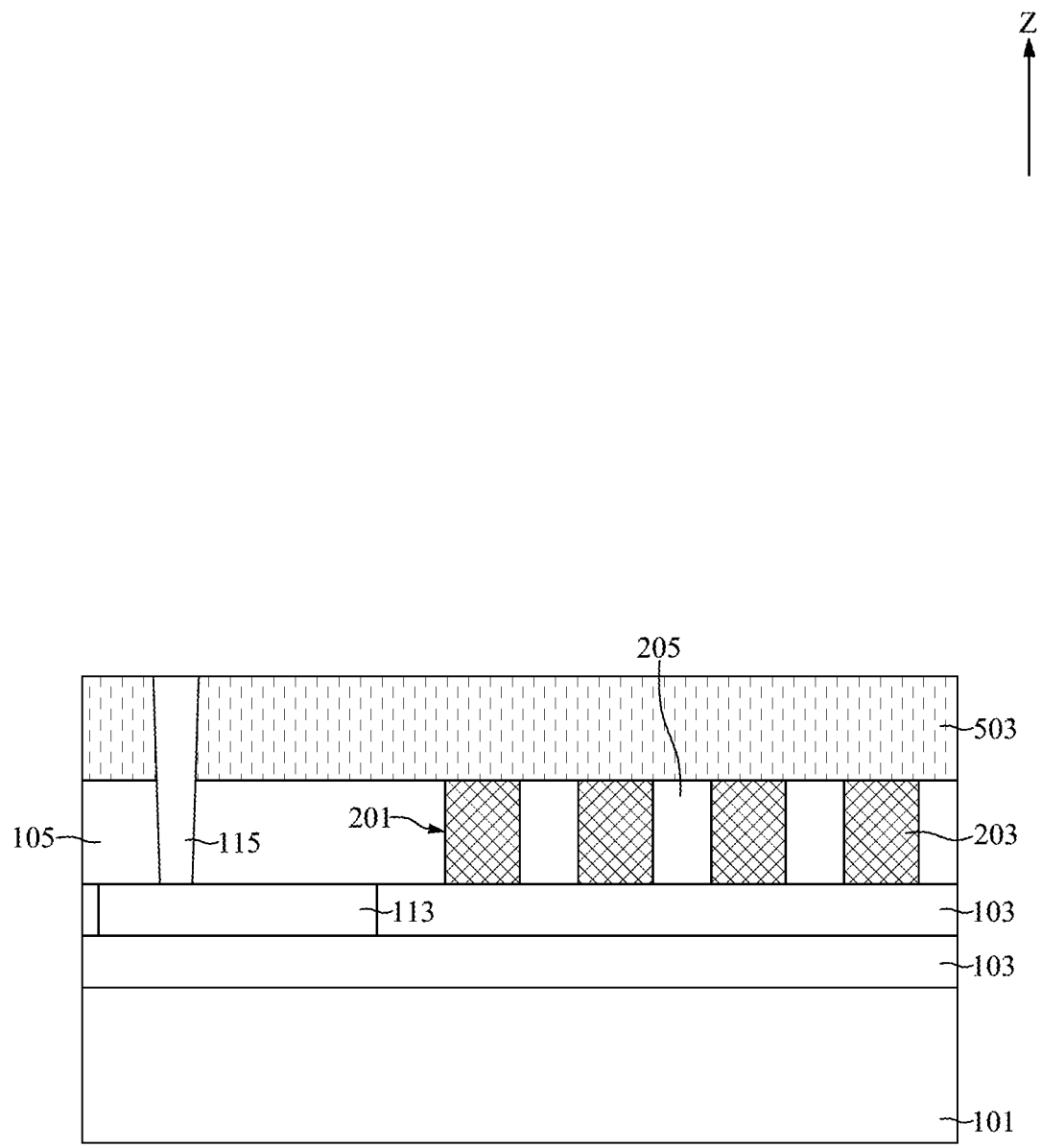
Figure 41:
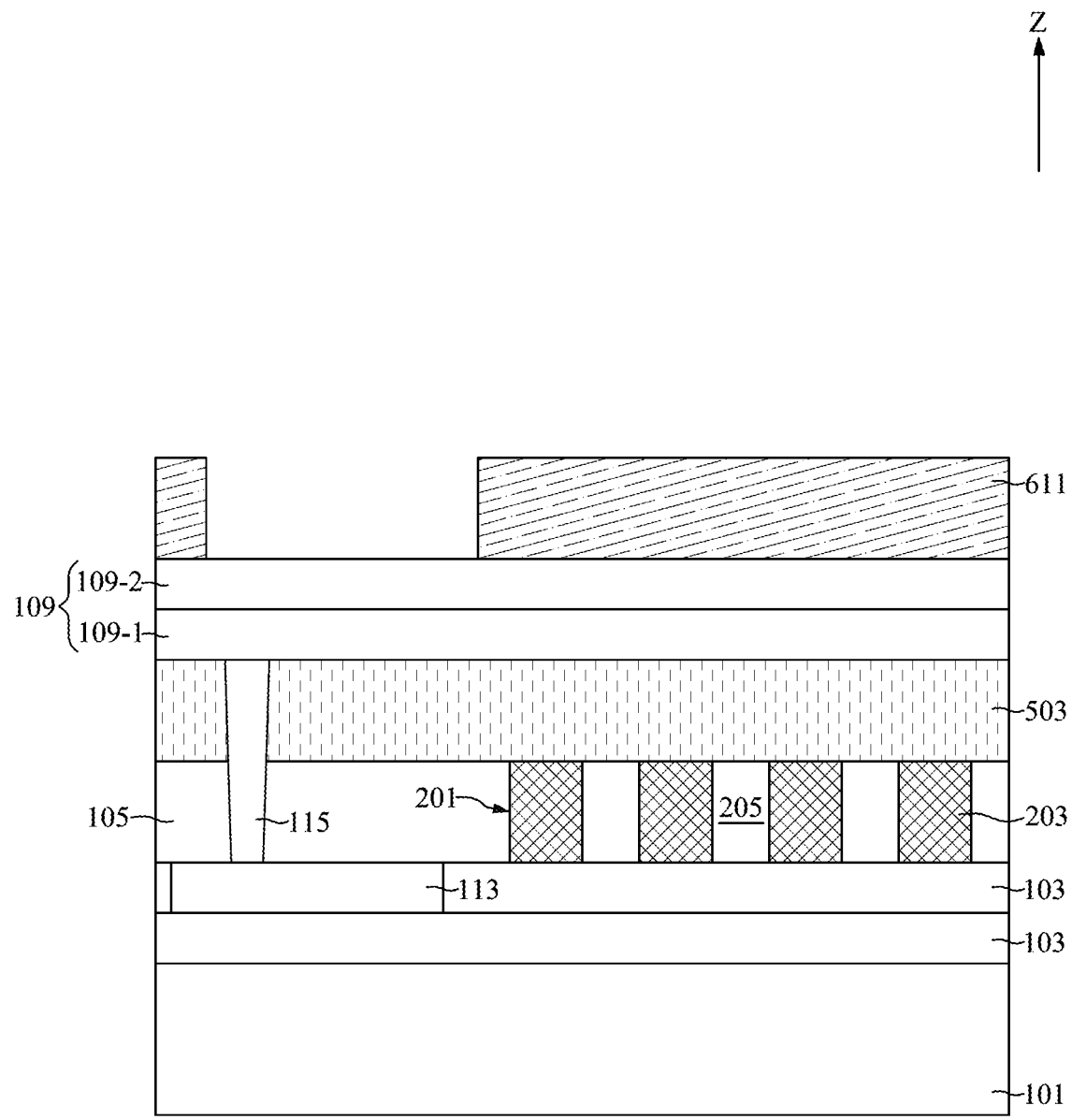
Figure 42:
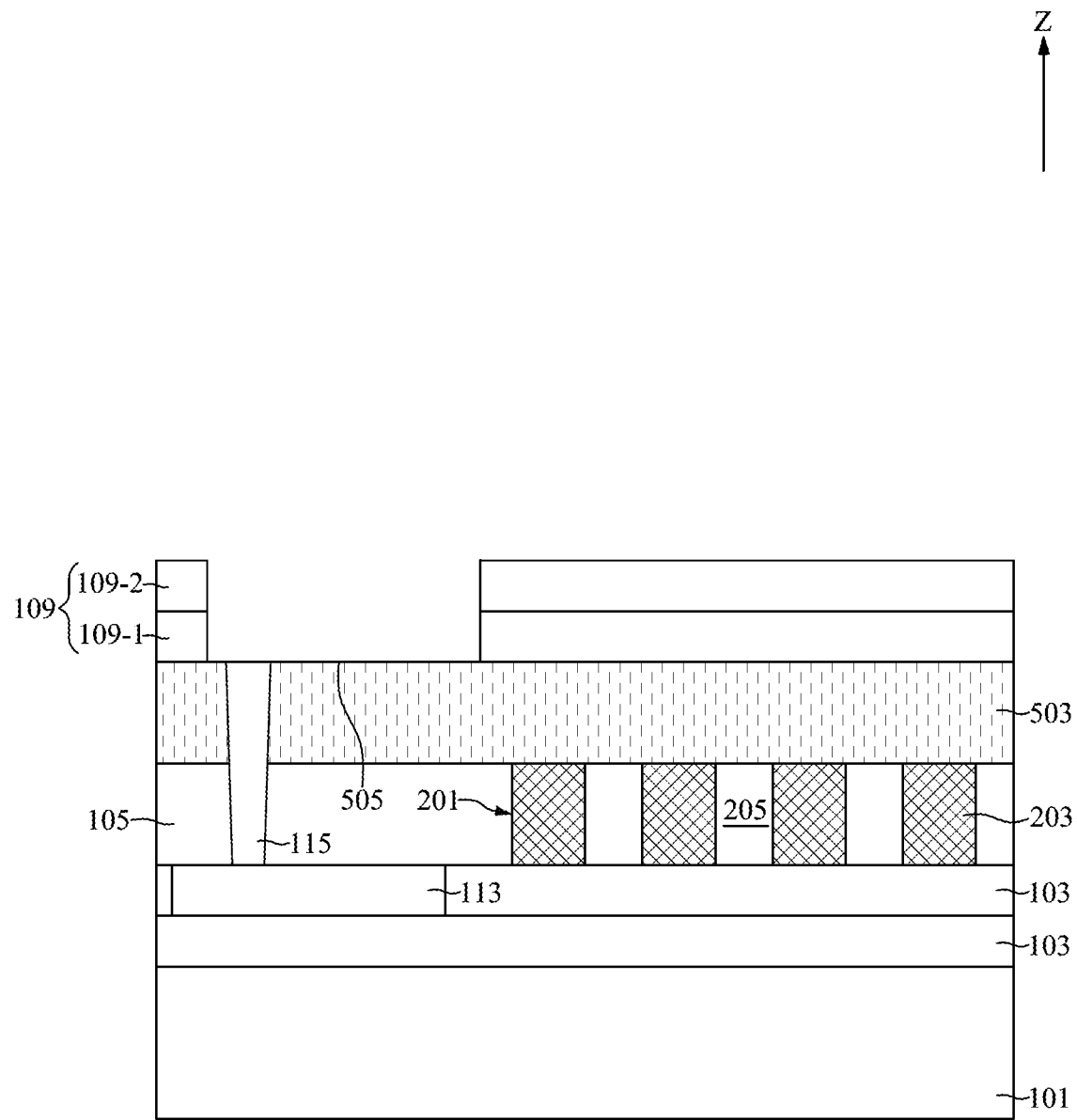

With reference to FIG. 39, an intermediate semiconductor device may be fabricated by a procedure similar to that illustrated in FIGS. 17 to 21. The stress-absorbing layer 503 may be formed on the first passivation film 105 by a deposition process such as chemical vapor deposition. With reference to FIG. 40, the conductive plug 115 may be formed so as to penetrate the stress-absorbing layer 503 and the first passivation film 105 and electrically connect to the topmost conductive layer 113. With reference to FIG. 41, the third bottom passivation film 109-1 and the third top passivation film 109-2 may be sequentially formed on the stress-absorbing layer 503. A photolithography process using a sixth mask layer 611 as a mask may be performed to define a position of the redistribution layer 501 on the third top passivation film 109-2. With reference to FIG. 42, after the photolithography process, an etch process, such as an anisotropic dry etch process, may be performed to form a redistribution layer opening 505 so as to penetrate the third top passivation film 109-2 and the third bottom passivation film 109-1.

Figure 43:
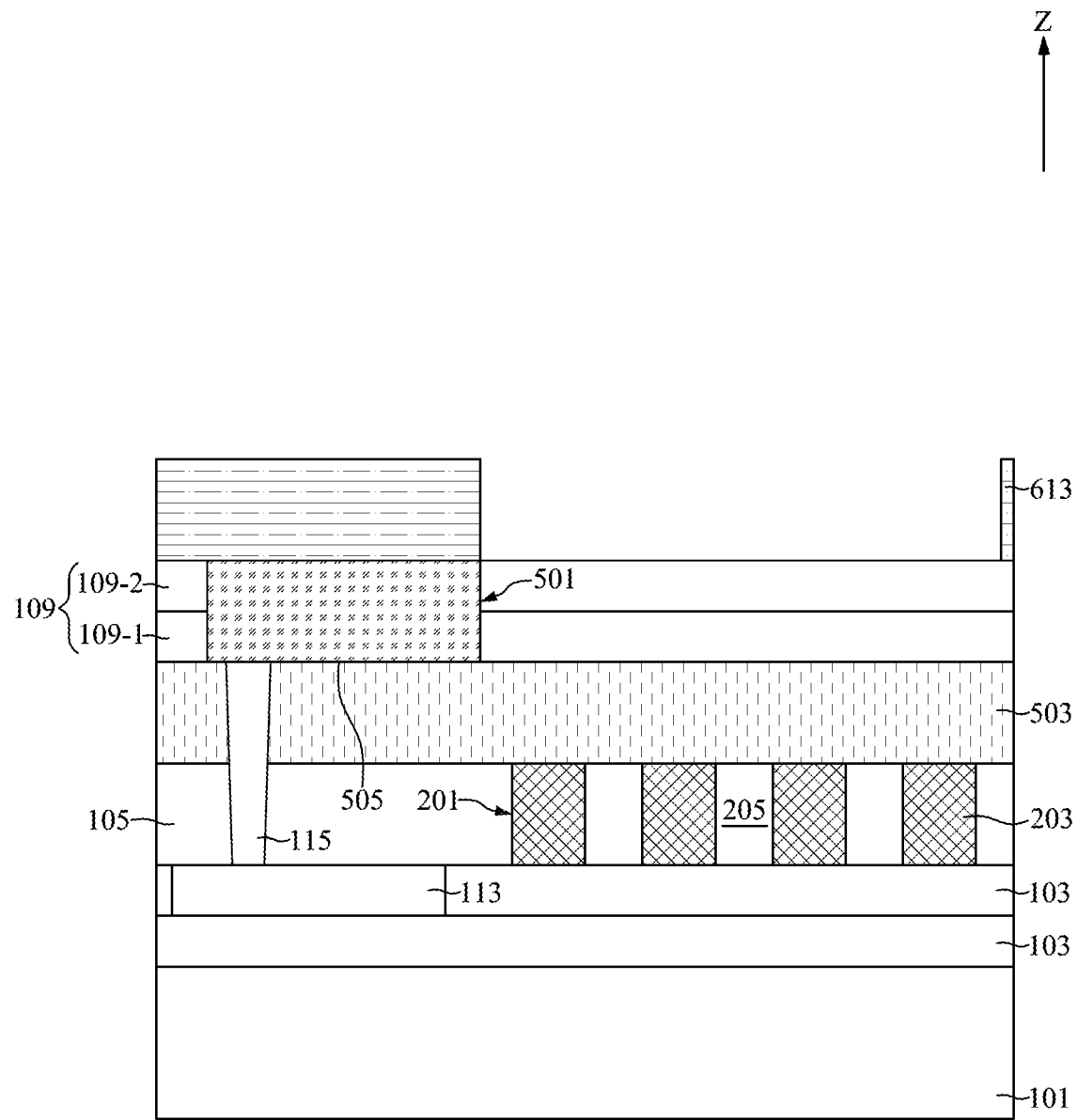

With reference to FIG. 43, a conductive material may be deposited into the redistribution layer opening 505 by a metallization process. After the metallization process, a planarization process, such as chemical mechanical polishing, may be performed to remove excess material, provide a substantially flat surface for subsequent processing steps, and conformally form the redistribution layer 501. A photolithography process using a seventh mask layer 613 as a mask may be performed to define the position of the bonding pad structure 301 on the third top passivation film 109-2.

Figure 44:
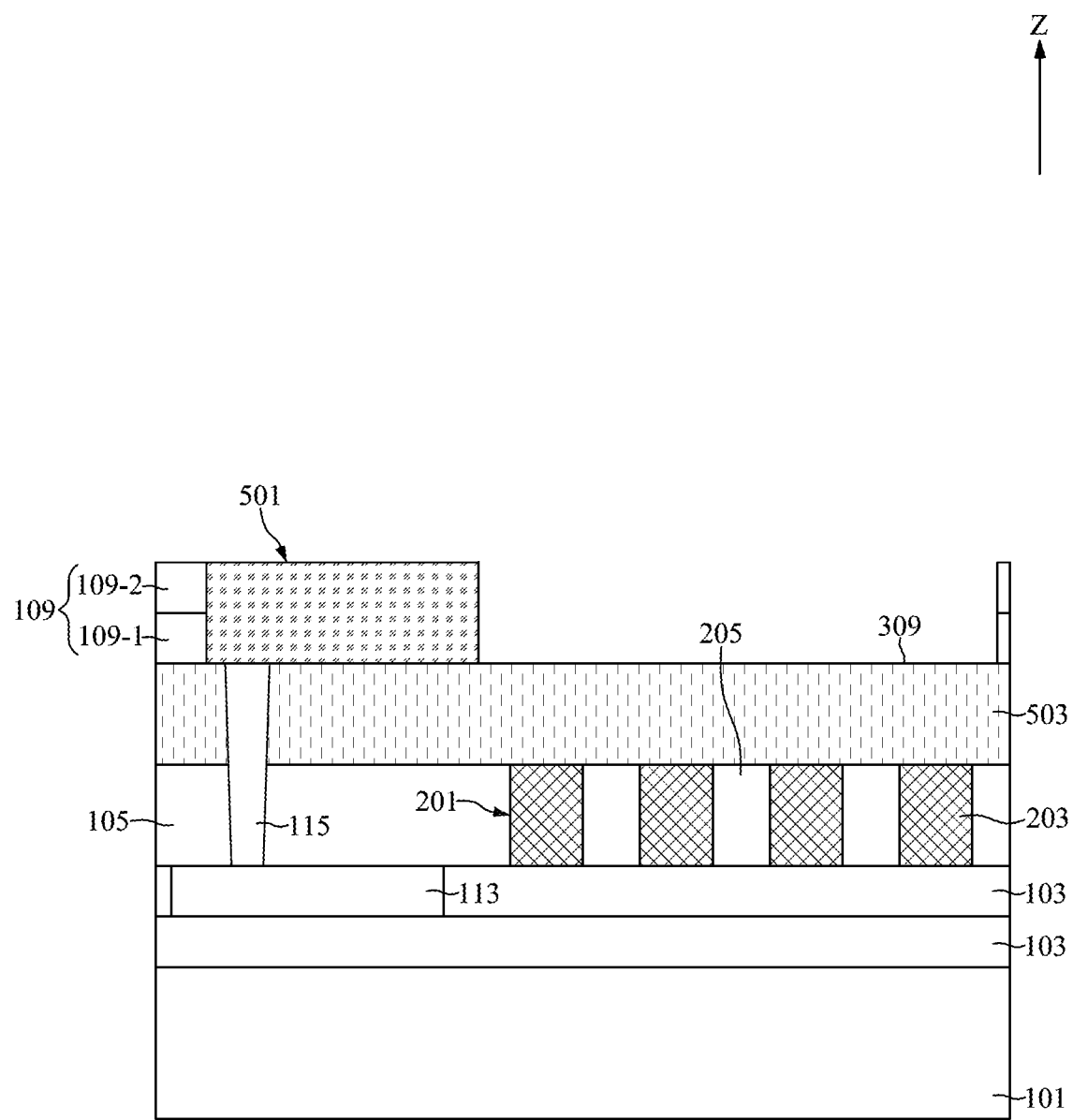
Figure 45:
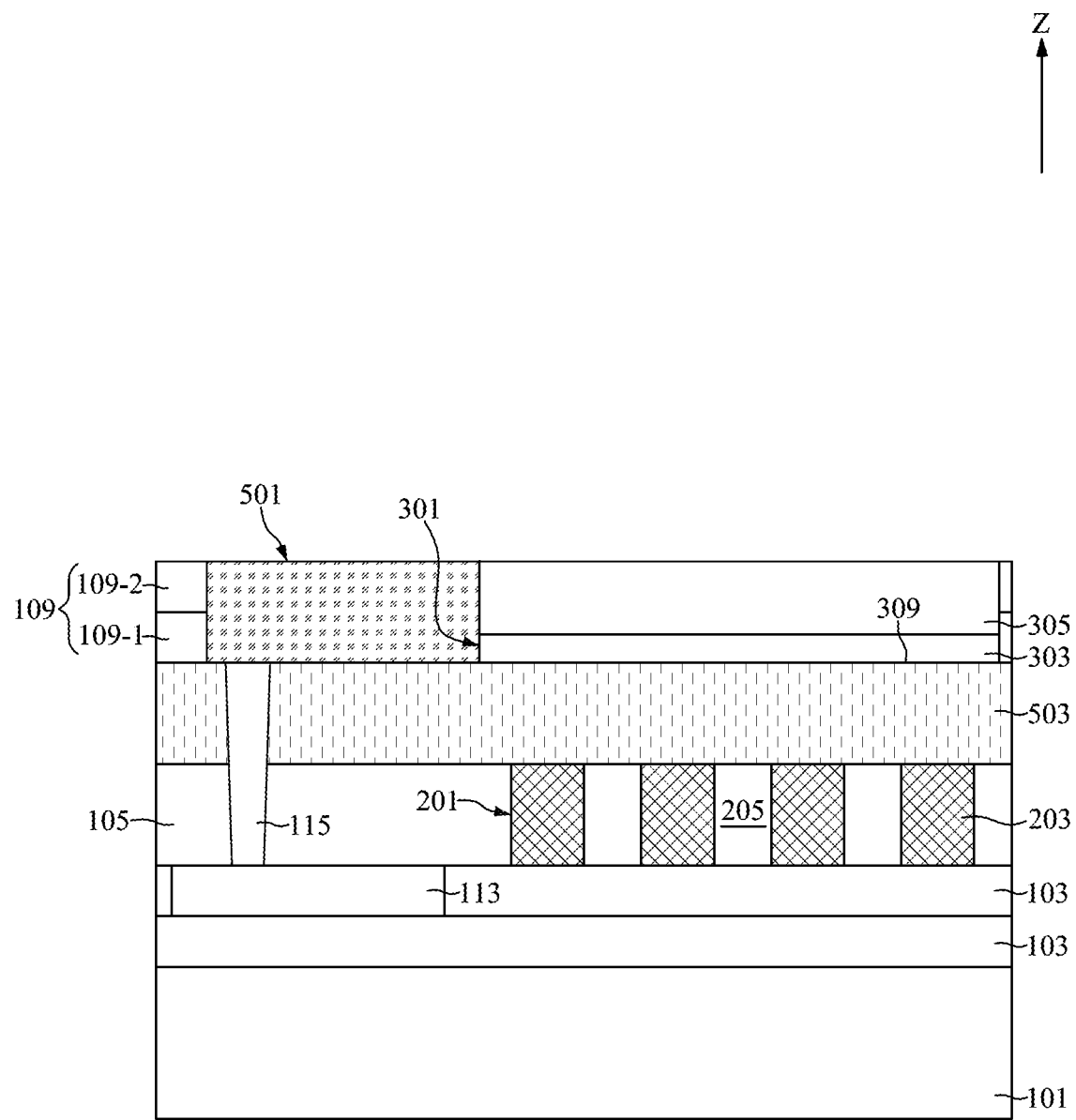

With reference to FIG. 44, after the photolithography process, an etch process, such as an anisotropic dry etch process, may be performed to form the bonding pad opening 309 so as to penetrate the third top passivation film 109-2 and the third bottom passivation film 109-1. With reference to FIG. 45, the bottom bonding pad 303 and the top bonding pad 305 may be sequentially formed in the bonding pad opening 309 and electrically connect to the redistribution layer 501. The other portions of the semiconductor device may be sequentially formed by a procedure similar to that illustrated in FIGS. 26 to 30.

Due to the design of the semiconductor device of the present disclosure, stress originating from a wiring process, a process of forming a solder bump, or a packaging process may be reduced by the supporting portion 405 of the conductive structure 401 and the stress-relieving structure 201. As a result, cracking of the semiconductor device or delamination of the plurality of interconnection films 103 may be avoided. Therefore, the quality or reliability of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
 a semiconductor substrate;
 a stress-relieving structure comprising a conductive frame positioned above the semiconductor substrate and a plurality of insulating pillars positioned within the conductive frame; and
 a conductive structure comprising a supporting portion positioned above the stress-relieving structure, a conductive portion positioned adjacent to the supporting portion, and a plurality of spacers attached to two sides of the conductive portion;

wherein a width of the conductive frame is equal to a width of a bottom of the conductive portion.

2. The semiconductor device of claim 1, wherein the conductive portion is positioned above the conductive frame.

3. The semiconductor device of claim 2, wherein a width of a bottom of the conductive structure is greater than a width of the stress-relieving structure.

4. The semiconductor device of claim 3, further comprising a bonding pad structure positioned between the conductive structure and the stress-relieving structure, wherein a top surface of the bonding pad structure is in contact with the bottom of the conductive portion.

5. The semiconductor device of claim 4, wherein the bonding pad structure comprises a bottom bonding pad positioned between the conductive structure and the stress-relieving structure and a top bonding pad positioned on the bottom bonding pad, wherein a top surface of the top bonding pad is in contact with the bottom of the conductive portion.

6. The semiconductor device of claim 5, wherein a width of the bonding pad structure is greater than the width of the bottom of the conductive structure.

7. The semiconductor device of claim 6, wherein the conductive structure comprises an upper conductive portion positioned on the supporting portion and the conductive portion.

8. The semiconductor device of claim 7, further comprising a bottom passivation film positioned above the semiconductor substrate and a top passivation film positioned on the bottom passivation film, wherein the bonding pad structure is positioned in the bottom passivation film and the top passivation film.

9. The semiconductor device of claim 7, further comprising a pair of pad spacers attached to two sides of the bonding pad structure.

10. The semiconductor device of claim 7, further comprising a conductive covering film covering the plurality of spacers, portions of the top surface of the top bonding pad, and a top surface of the supporting portion.

11. The semiconductor device of claim 7, further comprising a bottom passivation film positioned above the semiconductor substrate and a top passivation film positioned on the bottom passivation film, wherein the supporting portion and the conductive portion are positioned in the bottom passivation film and the top passivation film.

12. The semiconductor device of claim 7, further comprising a bottom passivation film positioned above the semiconductor substrate and a top passivation film positioned on the bottom passivation film, wherein the supporting portion and the conductive portion are positioned in the bottom passivation film and the top passivation film, and the supporting portion comprises a lower segment positioned at a same vertical level as the bottom passivation film and an upper segment positioned on the lower segment and at a same vertical level as the top passivation film.

13. The semiconductor device of claim 7, wherein a horizontal cross-sectional profile of the conductive frame appears as a mesh, concentric rings, or a shape resembling a steering wheel.

14. The semiconductor device of claim 7, wherein a horizontal cross-sectional profile of the supporting portion appears as a mesh, regularly-aligned pillars, or concentric rings.

15. The semiconductor device of claim 7, further comprising a redistribution layer positioned above the semiconductor substrate and electrically coupled to the bonding pad structure.

16. The semiconductor device of claim 7, further comprising a stress-absorbing layer positioned between the stress-relieving structure and the bonding pad structure, wherein the stress-absorbing layer is formed of a material having a coefficient of thermal expansion of less than about 20 ppm/° C. and a Young's Modulus of less than about 15 GPa.

17. The semiconductor device of claim 16, further comprising a redistribution layer positioned above the stress-absorbing layer and electrically coupled to the bonding pad structure.

18. The semiconductor device of claim 16, further comprising a redistribution layer positioned above the semiconductor substrate, wherein the redistribution layer comprises a lower staggered segment positioned at a same vertical level as the stress-absorbing layer and an upper staggered segment positioned on the lower staggered segment and adjacent to the bonding pad structure.

19. A method for fabricating a semiconductor device, comprising:
   providing a semiconductor substrate;
   forming a stress-relieving structure comprising a conductive frame above the semiconductor substrate and a plurality of insulating pillars within the conductive frame; and
   forming a conductive structure comprising a supporting portion above the stress-relieving structure, a conductive portion adjacent to the supporting portion, and a plurality of spacers attached to two sides of the conductive portion.

20. The method for fabricating the semiconductor device of claim 19, wherein forming the stress-relieving structure comprising the conductive frame above the semiconductor substrate and the plurality of insulating pillars within the conductive frame comprises:
   forming a first passivation film above the semiconductor substrate;
   performing a photolithography process to define a position of the stress-relieving structure on the first passivation film;
   performing an etch process to form a conductive frame opening in the first passivation film;
   depositing a conductive material into the conductive frame opening; and
   performing a planarization process to concurrently form the conductive frame and the plurality of insulating pillars.

* * * * *